(12) United States Patent
Nojima et al.

(10) Patent No.: US 9,419,040 B2
(45) Date of Patent: Aug. 16, 2016

(54) IMAGE PICKUP APPARATUS, SEMICONDUCTOR DEVICE, AND ELECTRONIC DEVICE INCLUDING A BURIED PORTION DISPOSED ADJACENT TO A BONDING PORTION, AND METHOD FOR MANUFACTURING THE SAME

(71) Applicant: Sony Corporation, Tokyo (JP)

(72) Inventors: Kenta Nojima, Kumamoto (JP); Kengo Kotoo, Kumamoto (JP); Hirotaka Yoshioka, Kumamoto (JP); Kenta Ikeda, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/604,273

(22) Filed: Jan. 23, 2015

(65) Prior Publication Data
US 2015/0214263 A1     Jul. 30, 2015

(30) Foreign Application Priority Data
Jan. 30, 2014 (JP) .................................. 2014-015152

(51) Int. Cl.
*H01L 21/00* (2006.01)
*H01L 27/146* (2006.01)

(52) U.S. Cl.
CPC ...... *H01L 27/14634* (2013.01); *H01L 27/1464* (2013.01); *H01L 27/1469* (2013.01); *H01L 27/14636* (2013.01)

(58) Field of Classification Search
CPC .................. H01L 27/14634; H01L 27/14636; H01L 27/1464; H01L 27/1469
USPC ........ 438/85, 462, 57; 257/758, 437; 348/308
See application file for complete search history.

(56) References Cited

U.S. PATENT DOCUMENTS

| | | | | |
|---|---|---|---|---|
| 2003/0094896 A1* | 5/2003 | Valentine | ............... | H05B 33/10 313/506 |
| 2004/0077757 A1* | 4/2004 | Araki | .................. | C09D 171/02 524/264 |
| 2005/0282306 A1* | 12/2005 | Yamanaka | ........ | H01L 27/14618 438/57 |
| 2009/0256260 A1* | 10/2009 | Nakamura | ........ | H01L 27/14618 257/758 |
| 2011/0102657 A1* | 5/2011 | Takahashi | ............. | H01L 23/481 348/308 |
| 2013/0134542 A1* | 5/2013 | Lu | ..................... | H01L 27/14618 257/437 |
| 2013/0323908 A1* | 12/2013 | Wang | ..................... | H01L 21/78 438/462 |

\* cited by examiner

*Primary Examiner* — Mohammed Shamsuzzaman
(74) *Attorney, Agent, or Firm* — Sheridan Ross P.C.

(57) ABSTRACT

There is provided a solid state image pickup apparatus including a first semiconductor substrate and a second semiconductor substrate which are bonded to each other, and a buried portion formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

14 Claims, 17 Drawing Sheets

IMAGE PICKUP APPARATUS, SEMICONDUCTOR DEVICE, AND ELECTRONIC DEVICE INCLUDING A BURIED PORTION DISPOSED ADJACENT TO A BONDING PORTION, AND METHOD FOR MANUFACTURING THE SAME

CROSS REFERENCE TO RELATED APPLICATIONS

This application claims the benefit of Japanese Priority Patent Application JP 2014-015152 filed Jan. 30, 2014, the entire contents of which are incorporated herein by reference.

BACKGROUND

The present disclosure relates to a solid state image pickup apparatus and a method for manufacturing the same, a semiconductor device, and an electronic device and particularly relates to a solid state image pickup apparatus capable of increasing the reliability in a semiconductor chip in which two semiconductor substrates are bonded to each other and a method for manufacturing the same, a semiconductor device, and an electronic device.

A process for manufacturing the semiconductor chip includes a process for forming a plurality of semiconductor chips on a wafer, and then performing dicing of the wafer along a scribe line provided around the semiconductor chips with a blade to singulate the wafer into individual semiconductor chips.

On the scribe line, a wiring layer is not disposed in order not to block the dicing in many cases. In this case, due to the fact that the wiring layer is not present, recessed steps are formed as compared with a region where the wiring layer is present of the semiconductor chip.

In the semiconductor chip manufactured by bonding two semiconductor substrates, the bonded surface has recessed steps, and therefore the recessed step portions form voids in some cases. In the following process, the voids are likely to cause separation between the substrates with the voids as the starting point and also cause contamination of mixing with other metals and the like.

In the semiconductor chip in which two semiconductor substrates are bonded to each other, the bonded surface of the two semiconductor substrates is exposed in the state where the wafer is singulated into a chip after dicing. Therefore, cracks are likely to be formed with the bonded surface as the starting point or moisture absorption occurs with the cracks as the starting point.

On the other hand, JP 2013-62382A, for example, discloses a structure in which even when horizontal cracks are formed with the bonded surface as the starting point, the horizontal cracks are prevented from entering the semiconductor chip by forming grooves at an inner side of the semiconductor chip relative to the dicing line.

Moreover, JP 2010-56319A discloses a structure in which an adhesive with low hardness for bonding substrates to each other is not present on the dicing line. Thus, an interface of materials with greatly different hardness is not present on the dicing line. Therefore, the dicing is stabilized and the occurrence of chipping into the chip is prevented.

SUMMARY

However, with the technique of JP 2013-62382A, the horizontal cracks may enter up to the grooves, which raises a concern that moisture absorption into the semiconductor chip occurs from the cracks. Moreover, when the grooves are hollow, the state of the semiconductor chip is equal to the state where the bonded surface has voids, which raises a concern that the bonding strength decreases.

In the structure of JP 2010-56319A, due to the fact that there is no adhesive on the dicing line, the state of the semiconductor chip is equal to the state where the bonded surface has voids, which raises a concern that the bonding strength decreases.

The present disclosure has been made in view of such circumstances and can increase reliability in a semiconductor chip in which two semiconductor substrates are bonded to each other.

According to a first embodiment of the present disclosure, there is provided a solid state image pickup apparatus including a first semiconductor substrate and a second semiconductor substrate which are bonded to each other, and a buried portion formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

According to a second embodiment of the present disclosure, there is provided a method for manufacturing a solid state image pickup apparatus, the method including forming a groove portion of a predetermined depth with a width larger than a dicing width in a scribe region to each of a first insulating film formed on a first semiconductor substrate and a second insulating film formed on a second semiconductor substrate, bonding the first semiconductor substrate and the second semiconductor substrate after burying a material of a buried portion into at least one of the groove portion individually formed in each of the first insulating film and the second insulating film, and performing dicing of the first semiconductor substrate and the second semiconductor substrate which are bonded to each other along the scribe region to thereby form the buried portion formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

In the second embodiment of the present disclosure, a groove portion of a predetermined depth with a width larger than a dicing width is formed in a scribe region to each of a first insulating film formed on a first semiconductor substrate and a second insulating film formed on a second semiconductor substrate, the first semiconductor substrate and the second semiconductor substrate are bonded to each other after a material of a buried portion is buried into at least one of the groove portion individually formed in each of the first insulating film and the second insulating film, and dicing of the first semiconductor substrate and the second semiconductor substrate which are bonded to each other is performed along the scribe region, thereby the buried portion is formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

According to a third embodiment of the present disclosure, there is provided a semiconductor apparatus including a first semiconductor substrate and a second semiconductor substrate which are bonded to each other, and a buried portion formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

According to a fourth embodiment of the present disclosure, there is provided an electronic device including a first semiconductor substrate and a second semiconductor substrate which are bonded to each other, and a buried portion formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

The first, third, and fourth embodiments of the present disclosure are configured so that the first semiconductor substrate and the second semiconductor substrate are bonded to be each other and a buried portion is formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

Each of the solid state image pickup apparatus, the semiconductor device, and the electronic device may be an independent apparatus or may be a module placed in another apparatus.

According to the first to third embodiments of the present disclosure, the reliability can be increased in the semiconductor chip in which two semiconductor substrates are bonded to each other.

The effects described here are not necessarily limited and also may be any effect described in the present disclosure.

DETAILED DESCRIPTION OF THE EMBODIMENTS

Hereinafter, embodiments for carrying out the present disclosure (hereinafter referred to as embodiments) will be described. The description is given in the following order: 1. Entire Configuration of Solid State Image Pickup Apparatus, 2. First Embodiment of Solid State Image Pickup Apparatus (Example of Configuration Having Buried Portion Only in Peripheral Portion), 3. First Manufacturing Method of First Embodiment, 4. Second Manufacturing Method of First Embodiment, 5. Second Embodiment of Solid State Image Pickup Apparatus (Example of Configuration Having Buried Portion in Entire Bonded Surface), 6. Manufacturing Method of Second Embodiment, and 7. Application Example to Electronic Device of Second Embodiment.

1. Entire Configuration of Solid State Image Pickup Apparatus

Example of Schematic Configuration of Solid State Image Pickup Apparatus

Figure 1:
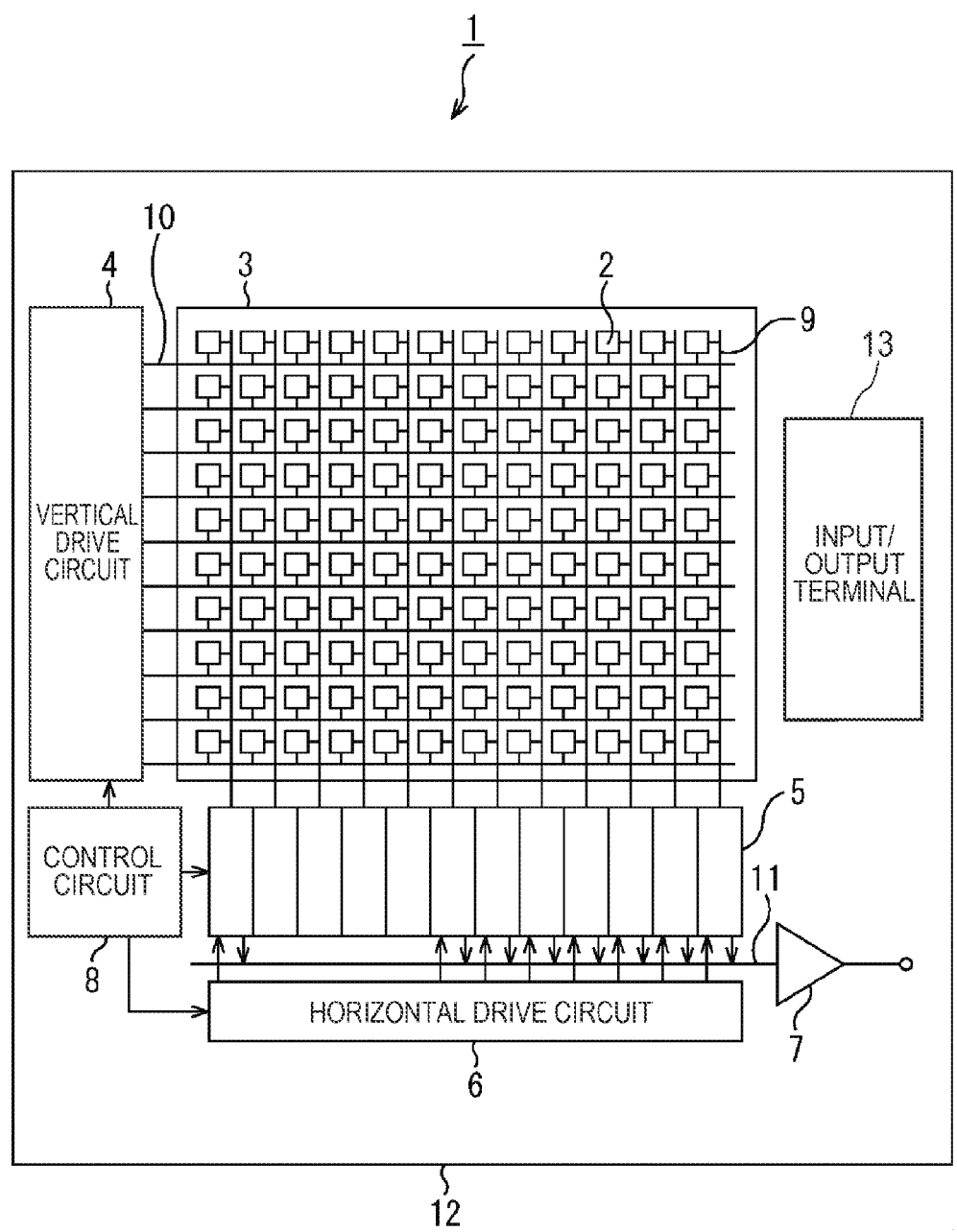
FIG. 1 is a view illustrating the schematic configuration of a solid state image pickup apparatus according to an embodiment of the present disclosure.

FIG. 1 illustrates the schematic configuration of a solid state image pickup apparatus according to an embodiment of the present disclosure.

A solid state image pickup apparatus 1 of FIG. 1 is configured so that a pixel array portion 3 in which pixels 2 are arranged in the shape of a two-dimensional array and peripheral circuit units around the same are provided on a semiconductor substrate 12 containing silicon (Si) as a semiconductor. Examples of the peripheral circuit units include a vertical drive circuit 4, column signal processing circuits 5, a horizontal drive circuit 6, an output circuit 7, a control circuit 8, and the like.

The pixels 2 have a photodiode as a photoelectric conversion element and a plurality of pixel transistors. The plurality of pixel transistors contain four MOS transistors of a transmission transistor, a selection transistor, a reset transistor, and an amplification transistor, for example.

Moreover, the pixels 2 can also be configured to have a pixel sharing structure. The pixel sharing structure is constituted by a plurality of photodiodes, a plurality of transmission transistors, one floating diffusion (floating diffusion region) to be shared, and the other individual pixel transistors to be shared. More specifically, the shared pixels are configured so that the photodiodes and the transmission transistors constitute a plurality of unit pixels share the other individual pixel transistors.

The control circuit 8 receives an input clock and data of directing an operation mode and the like and also outputs data of inside information and the like of the solid state image pickup apparatus 1. More specifically, the control circuit 8 generates a clock signal and a control signal serving as the standard of operations of the vertical drive circuit 4, the column signal processing circuits 5, the horizontal drive circuit 6, and the like based on a vertical synchronizing signal, a horizontal synchronizing signal, and a master clock. Then, the control circuit 8 outputs the generated clock signal and the generated control signal to the vertical drive circuit 4, the column signal processing circuits 5, the horizontal drive circuit 6, and the like.

The vertical drive circuit 4 is constituted by a shift register, for example, and selects a predetermined pixel driving wiring line 10, and then supplies a pulse for driving the pixels 2 to the selected pixel driving wiring line 10 to drive the pixels 2 in units of columns. More specifically, the vertical drive circuit 4 successively selects and scan each pixel 2 of the pixel array portion 3 in the vertical direction in units of columns, and supplies a pixel signal based on a signal charge generated according to the amount of received light in the photoelectric conversion element of each pixel 2 to the column signal processing circuits 5 through vertical signal lines 9.

The column signal processing circuit 5 is disposed in each column of the pixels 2, and performs signal processing, such as noise rejection, of the signals output from the pixels 2 of one row for each pixel column. For example, the column signal processing circuits 5 perform signal processing, such as correlated double sampling (CDS) for removing a fixed pattern noise peculiar to a pixel and AD conversion.

The horizontal drive circuit 6 is, for example, constituted by a shift register and successively outputting a horizontal scanning pulse to thereby select each of the column signal processing circuits 5 in order, and then outputs a pixel signal from each of the column signal processing circuits 5 to a horizontal signal line 11.

The output circuit 7 performs signal processing of signals successively supplied through the horizontal signal line 11 from each of the column signal processing circuits 5, and then outputs the processed signals. The output circuit 7 sometimes performs only buffering or sometimes performs black level adjustment, column variation correction, various kinds of digital signal processing, and the like, for example. An input/output terminal 13 exchanges signals with the outside.

The solid state image pickup apparatus 1 configured as described above is a CMOS image sensor referred to as a column AD type in which the column signal processing circuit 5 which performs CDS processing and AD conversion processing are disposed in each pixel column.
Example of Circuit Configuration of Pixel 2

Figure 2:
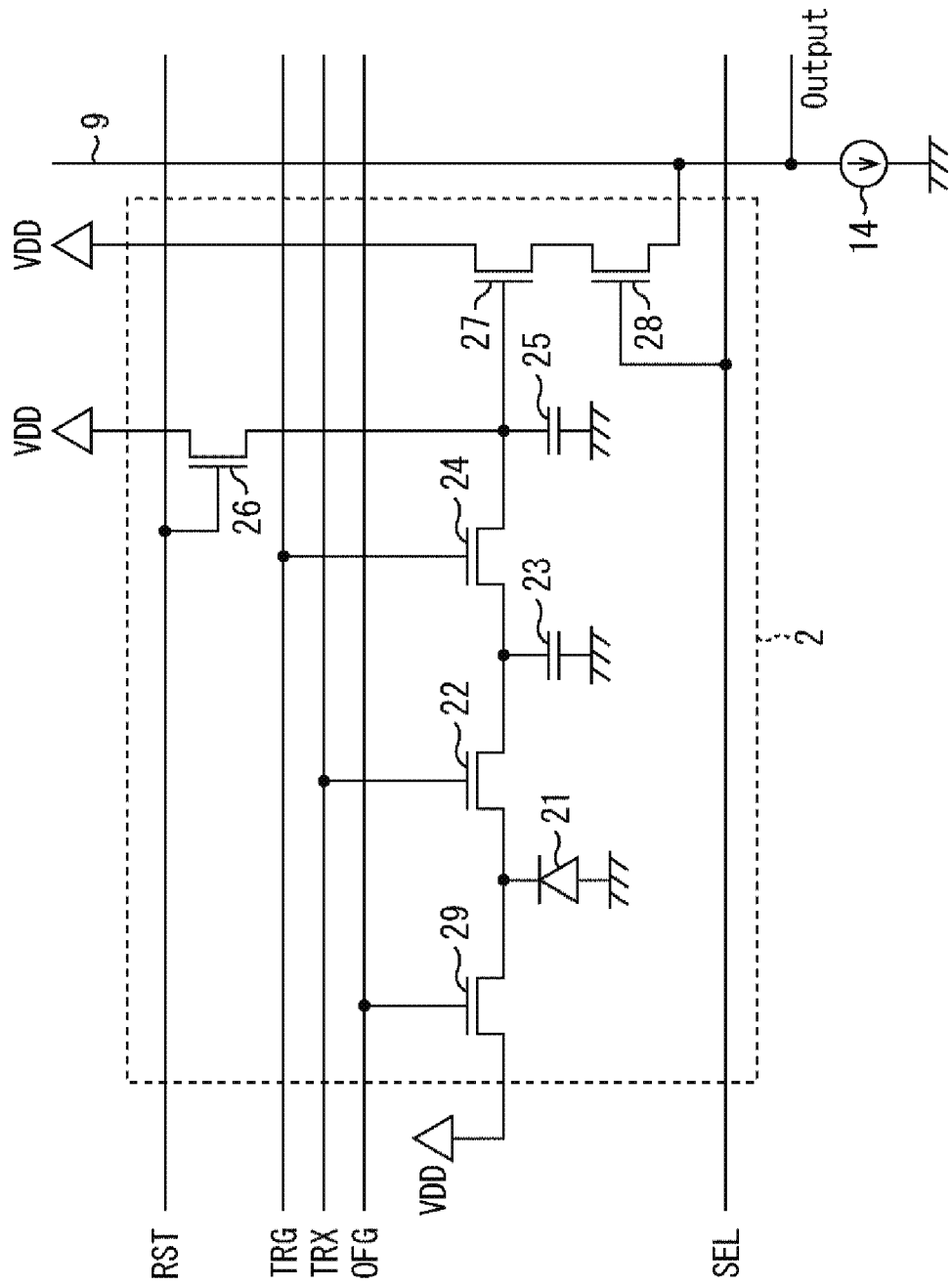
FIG. 2 is a view illustrating an equivalent circuit of a pixel.

FIG. 2 illustrates an equivalent circuit of the pixel 2.

The pixel 2 has a photodiode 21 as a photoelectric conversion element, a first transmission transistor 22, a memory unit (MEM) 23, a second transmission transistor 24, a floating diffusion (FD) 25, a reset transistor 26, an amplification transistor 27, a selection transistor 28, and a discharge transistor 29.

The photodiode 21 is a photoelectric conversion unit which generates a charge (signal charge) according to the amount of received light and accumulates the signal. An anode terminal of the photodiode 21 is grounded and a cathode terminal is connected to the memory unit 23 through the first transmission transistor 22. The cathode terminal of the photodiode 21 is also connected to the discharge transistor 29.

When turned on by a transmission signal TRX, the first transmission transistor 22 reads the charge generated by the photodiode 21, and then transmits the charge to the memory unit 23. The memory unit 23 is a charge holding unit which temporarily holds the charge until the charge is transmitted to the FD 25. When turned on by a transmission signal TRG, the second transmission transistor 24 transmits the charge held in the memory unit 23 to the FD 25.

The FD 25 is a charge holding unit for holding a charge read from the memory unit 23 in order to read the charge as a signal. When turned on by a reset signal RST, the reset transistor 26 resets an electric potential of FD 25 by discharging of the charge held in the FD 25 to a constant voltage source VDD.

The amplification transistor 27 outputs a pixel signal according to the electric potential of the FD 25. More specifically, the amplification transistor 27 constitutes a source follower circuit with a load MOS 14 as a constant current source, and pixel signals which exhibit a level based on the charge held in the FD 25 are output to the column signal processing circuits 5 (FIG. 1) through the selection transistor 28 from the amplification transistor 27. The load MOS 14 is provided in the column signal processing circuit 5, for example.

The selection transistor 28 is turned on when the pixel 2 is selected by the selection signal SEL, and then outputs a pixel signal of the pixel 2 to the column signal processing circuit 5 through the vertical signal line 9. When turned on by a discharge signal OFG, the discharge transistor 29 discharges unnecessary charges accumulated in the photodiode 21 to the constant voltage source VDD. The transmission signals TRX and TRG, the reset signal RST, the selection signal SEL, and the discharge signal OFG are controlled by the vertical drive circuit 4 to be supplied through the pixel driving wiring lines 10 (FIG. 1).

An operation of the pixel 2 is briefly described.

First, a discharge signal OFG of a High level is supplied to the discharge transistor 29 before starting exposure, and thus the discharge transistor 29 is turned on, and then the charges accumulated in the photodiode 21 are discharged to the constant voltage source VDD, so that the photodiode 21 is reset.

After the photodiode 21 is reset, when the discharge transistor 29 is turned off by a discharge signal OFG of a Low level, exposure is started in all the pixels.

When the predetermined exposure time passes, the first transmission transistor 22 is turned on by the transmission signal TRX in all the pixels of the pixel array portion 3, and then the charges accumulated in the photodiode 21 are transmitted to the memory unit 23.

After the first transmission transistor 22 is turned off, the charges held in the memory unit 23 of each pixel 2 are successively read to the column signal processing circuits 5 in units of rows. In the reading operation, the second transmission transistor 24 of the pixels 2 of the read rows is turned on by the transmission signal TRG, and then the charges held in the memory unit 23 are transmitted to the FD 25. Then, the selection transistor 28 is turned on by the selection signal SEL, and then signals which exhibit a level based on the charges held in the FD 25 are output from the amplification transistor 27 to the column signal processing circuits 5 through the selection transistor 28.

As described above, the pixels 2 having the pixel circuit of FIG. 2 can perform a global shutter operation (image pickup) by setting the exposure time to be the same in all the pixels of the pixel array portion 3, temporarily holding charges in the memory unit 23 after the end of exposure, and then successively reading the charges from the memory unit 23 in units of rows.

The circuit configuration of the pixels 2 is not limited to the configuration illustrated in FIG. 2 and a circuit configuration which does not have the memory unit 23 and performs an operation by a so-called rolling shutter system can also be adopted, for example.

Figure 3:
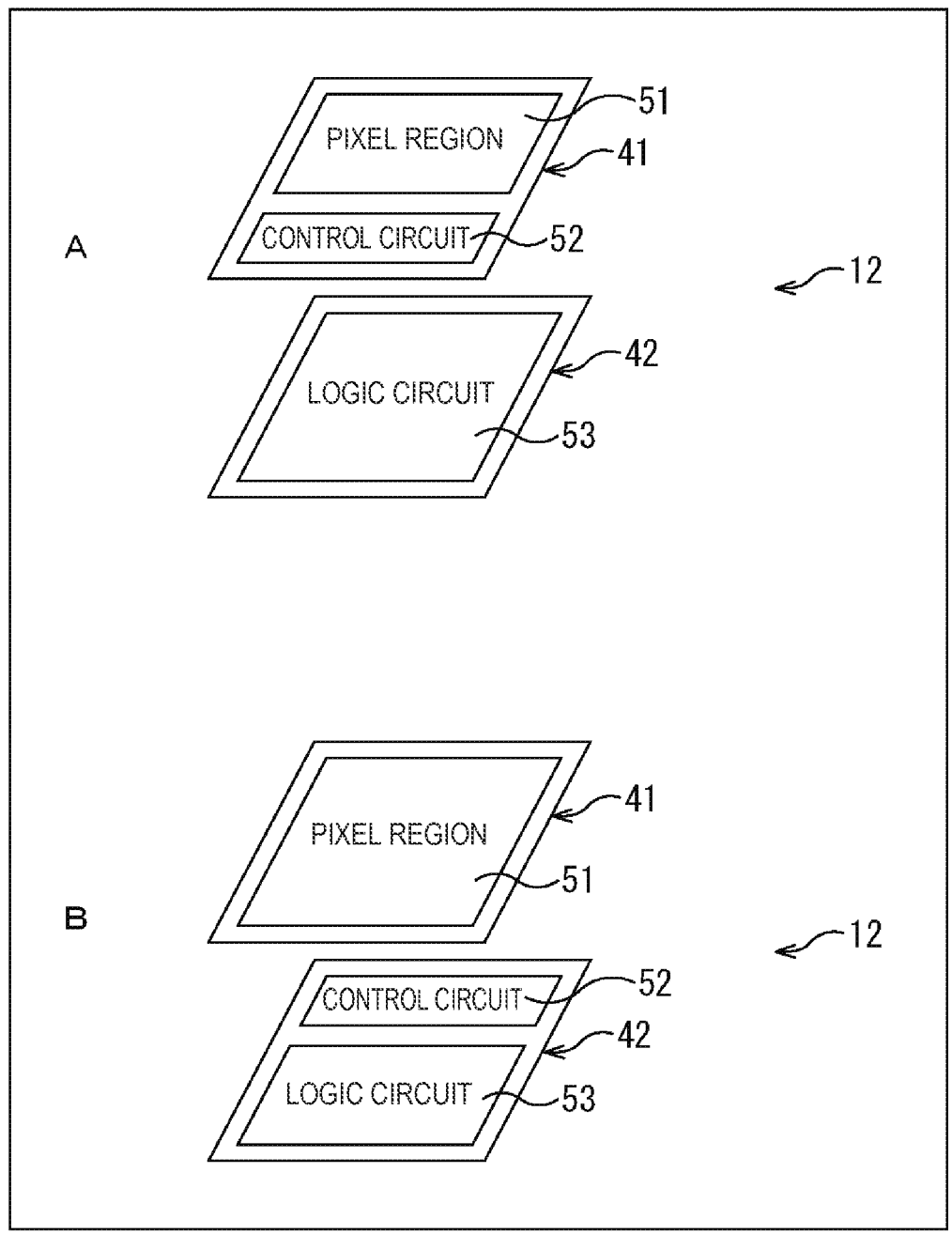
FIG. 3 is a view illustrating the configuration of a substrate of a solid state image pickup apparatus.

In more detail, the semiconductor substrate 12 on which the pixel array portion 3 and the like are formed is constituted by bonding of two semiconductor substrates of a first semiconductor substrate 41 and a second semiconductor substrate 42 as illustrated in FIG. 3A. The first semiconductor substrate 41 and the second semiconductor substrate 42 are bonded to each other by plasma bonding, for example.

On the first semiconductor substrate 41, a pixel region 51 where a circuit is formed in each pixel 2 and a control circuit 52 which controls each of the plurality of pixels 2 are formed and, on the second semiconductor substrate 4, a logic circuit 53, such as a signal processing circuit which processes a pixel signal output from each pixel 2, is formed as illustrated in FIG. 3A.

Or, as illustrated in FIG. 3B, it can also be configured so that only the pixel region 51 is formed on the first semiconductor substrate 41 and the control circuit 52 and the logic circuit 53 are formed on the second semiconductor substrate 42.

As described above, the solid state image pickup apparatus 1 is configured so that the logic circuit 53 or both the control circuit 52 and the logic circuit 53 is/are formed on the second semiconductor substrate 42 different from the first semiconductor substrate 41 on which the pixel region 51 is formed, and then the semiconductor substrates 41 and 42 are laminated. Thus, as compared with the case where the pixel region 51, the control circuit 52, and the logic circuit 53 are disposed in the direction of plane on one semiconductor substrate, the size as the solid state image pickup apparatus 1 can be reduced.

The following description is given referring to the first semiconductor substrate 41 on which at least the pixel region 51 is formed as a pixel sensor substrate 41 and referring to the second semiconductor substrate 42 on which at least the logic circuit 53 is formed as a logic substrate 42.

Upper Surface Configuration View of Semiconductor Wafer

Figure 4:
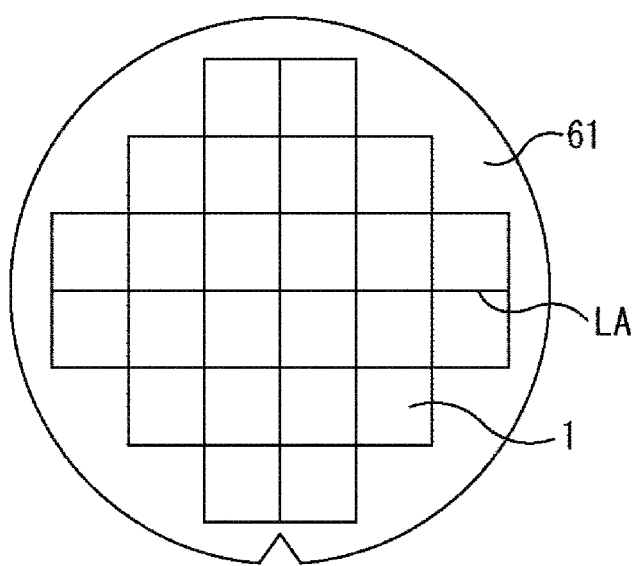
FIG. 4 is a view illustrating a state before a solid state image pickup apparatus is singulated.

The solid state image pickup apparatus 1 of FIG. 1 is equivalent to one obtained by dividing a plurality of pieces of the solid state image pickup apparatus 1 arranged on a large semiconductor wafer 61 illustrated in FIG. 4 into individual pieces. More specifically, by performing dicing of the large semiconductor wafer 61 using a blade (not illustrated) along a scribe region LA of the large semiconductor wafer 61, the semiconductor wafer 61 is singulated into a piece of the solid state image pickup apparatus 1, whereby the solid state image pickup apparatus 1 of FIG. 1 is formed.

2. First Embodiment
Cross-Sectional Structure View of Solid State Image Pickup Apparatus Next, the cross-sectional structure of the first embodiment of the solid state image pickup apparatus 1 is described with reference to FIG. 5.

Figure 5:
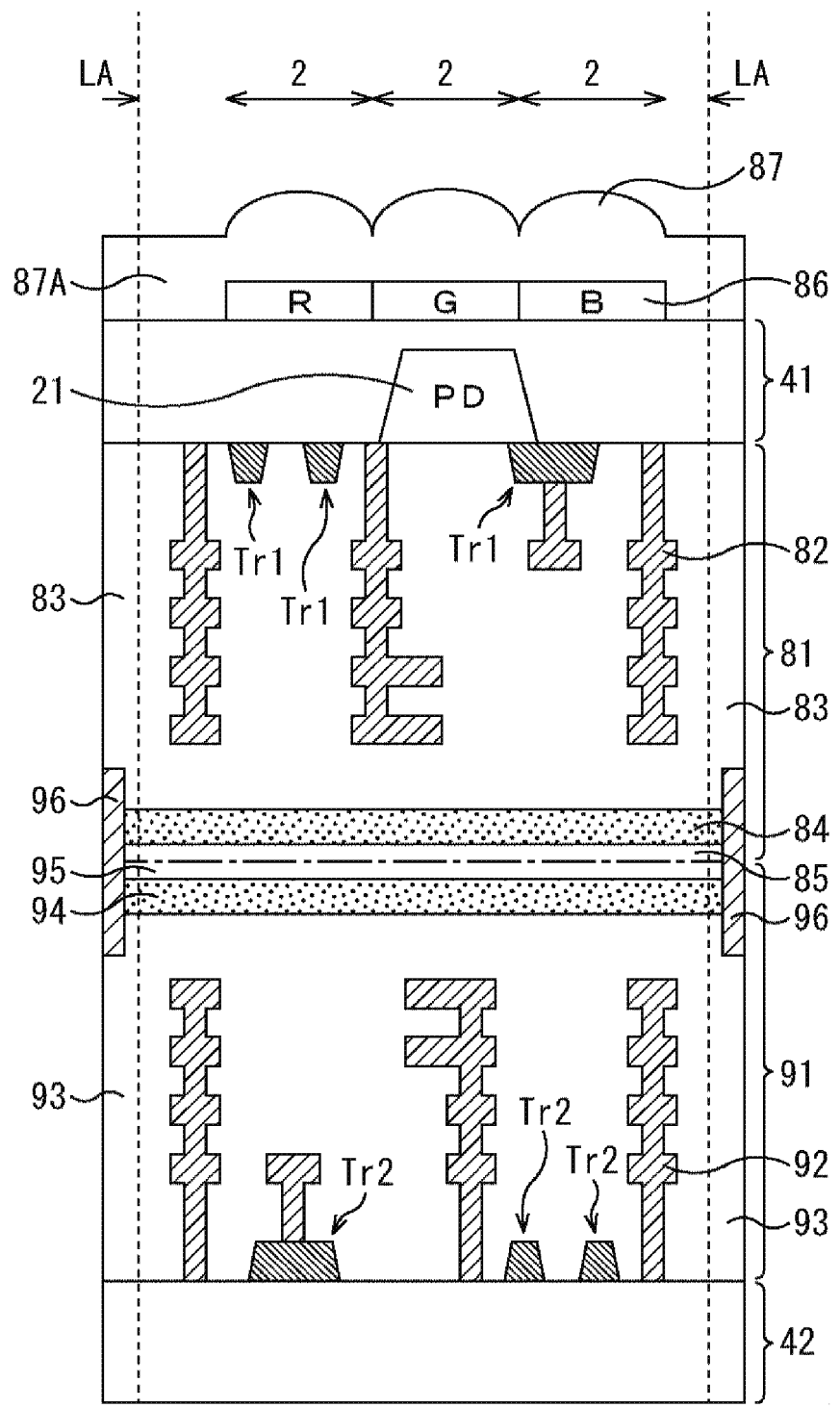
FIG. 5 is a view illustrating the cross-sectional structure of a first embodiment of a solid state image pickup apparatus.

FIG. 5 is a cross sectional view in which the solid state image pickup apparatus 1 is partially enlarged and is a cross-sectional view of a portion where the pixels 2 are disposed in the pixel array portion 3 and the scribe region LA equivalent to a peripheral portion of the singulated solid state image pickup apparatus 1.

In FIG. 5, some components are omitted or the size is different from the actual size in order to avoid a complicated view.

The solid state image pickup apparatus 1 is configured so that a multilayer wiring layer 81 formed on the pixel sensor substrate 41 and a multilayer wiring layer 91 formed on the logic substrate 42 face each other. In FIG. 5, the bonded surface of the multilayer wiring layer 81 and the multilayer wiring layer 91 is shown by the alternate long and short dash lines.

The multilayer wiring layer 81 on the side of the pixel sensor substrate 41 includes a plurality of wiring layers 82 and an interlayer insulating film 83 between each wiring layer 82.

In FIG. 5, at a lower side relative to the interlayer insulating film 83, a first insulating film 84 formed with a material different from a material of the interlayer insulating film 83 and a second insulating film 85 formed with a material different from a material of the first insulating film 84 are laminated. In this embodiment, the interlayer insulating film 83 and the second insulating film 85 are formed with a silicon oxide film, for example, and the first insulating film 84 is formed with a silicon nitride film, for example.

The plurality of wiring layers 82 are formed with metal materials, such as copper (Cu), aluminum (Al), and tungsten (W), for example. In each of the plurality of wiring layers 82 and the interlayer insulating films 83, all the layers may be formed with the same material or two or more materials may be selected depending on the layers.

On the interface with the pixel sensor substrate 41 in the multilayer wiring layer 81, a plurality of pixel transistors Tr1 (gate electrode) are formed in each pixel.

In the pixel sensor substrate 41, a photodiode 21 formed by PN junction is formed in each pixel 2. In FIG. 5, only one photodiode 21 corresponding to one pixel is illustrated.

On the other hand, on the surface of the pixel sensor substrate 41 opposite to the surface on which the multilayer wiring layer 81 is formed, a color filter 86 and an on-chip lens 87 are formed in each pixel 2. As the color filter 86, a R (red), G (green), or B (blue) filter is disposed in the Bayer arrangement, for example.

The on-chip lens 87 is formed by, for example, performing reflowing of an on-chip lens material 87A of a predetermined film thickness to have a lens shape in each pixel 2. On the other hand, in the scribe region LA and the like where the pixels 2 are not disposed, the on-chip lens material 87A is formed to be a flat surface.

On the other hand, the multilayer wiring layer 91 on the side of the logic substrate 42 includes a plurality of wiring layers 92 and an interlayer insulating film 93 between each wiring layer 92. Although not illustrated, the wiring layers 92 of the logic substrate 42 are connected to the wiring layers 82 of the pixel sensor substrate 41 through a penetration electrode, for example.

In FIG. 5, a first insulating film 94 formed with a material different from a material of the interlayer insulating film 93 and a second insulating film 95 formed with a material different from a material of the first insulating film 94 are laminated at an upper side relative to the interlayer insulating film 93 and the second insulating film 95 is bonded to the second insulating film 85 on the side of the pixel sensor substrate 41. The interlayer insulating film 93 and the second insulating film 95 are formed with a silicon oxide film, for example, and the first insulating film 94 is formed with a silicon nitride film, for example.

The interlayer insulating film 93, the first insulating film 94, and the second insulating film 95 may be all formed with the same insulating material or can also be formed by laminating three or more kinds of different insulating materials. The same applies to the interlayer insulating film 83, the first insulating film 84, and the second insulating film 85 described above.

On the interface with the logic substrate 42 in the multilayer wiring layer 91, a plurality of transistors Tr2 (gate electrode) contained in the logic circuit 53 are formed.

In the scribe region LA equivalent to the peripheral portion of the solid state image pickup apparatus 1, a buried portion 96 is disposed in such a manner that the bonded surface of the multilayer wiring layer 81 on the side of the pixel sensor substrate 41 and the multilayer wiring layer 91 on the side of the logic substrate 42 are not exposed to the outside.

In other words, the buried portion 96 is formed at a position in the scribe region LA in the direction of plane and in a region, including the bonded surface, from a part of the interlayer insulating films 83 on the side of the pixel sensor substrate 41 to a part of the interlayer insulating films 93 on the side of the logic substrate 42 in the depth direction.

The length (height) in the vertical direction of the buried portion 96 is determined by the depth of a groove portion 101 (FIG. 6) and a groove portion 111 (FIG. 8) described later, for example, and is about 2 to 20 μm. The length (width) in the horizontal direction of the buried portion 96 is equivalent to the remaining width (projection width Xc of FIG. 7) of one side of the groove portion 101 and the groove portion 111 after dicing and, for example, is 40 to about 90 μm.

A material of the buried portion 96 is desirably a material having heat resistance, moisture resistance, and crack resistance and having high bonding strength. As the material of the buried portion 96, resin having a Young's modulus of 2.9 Gpa or more and hygroscopicity of 0.24% or less, e.g., benzocyclobutene (BCB), can be used. In addition thereto, polyimide, photosensitive resist, organic resin, and inorganic resin can also be used as the material of the buried portion 96.

The solid state image pickup apparatus 1 configured as described above is a back side illumination MOS solid state image pickup apparatus in which light enters from the back surface opposite to the front surface of the pixel sensor substrate 41 on which the pixel transistors Tr1 are formed.

3. First Manufacturing Method of First Embodiment

A first manufacturing method of the solid state image pickup apparatus 1 having the cross-sectional structure illustrated in FIG. 5 is described with reference to FIGS. 6 to 9.

Figure 6:
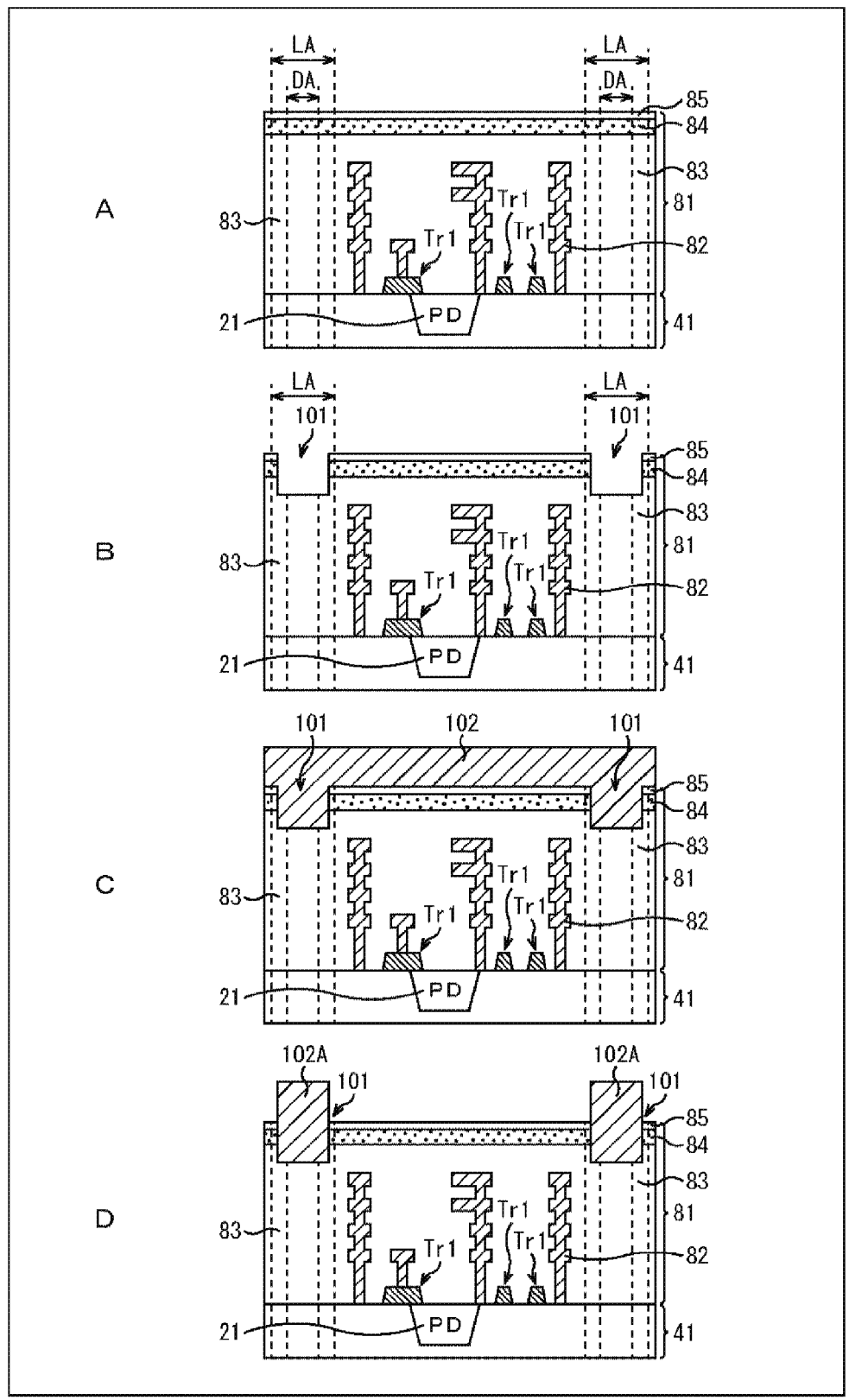
FIG. 6 is a view explaining a first manufacturing method of the first embodiment of the solid state image pickup apparatus.

FIG. 6 is a view illustrating a manufacturing process of the pixel sensor substrate 41 before bonding.

First, as illustrated in FIG. 6A, the photodiode 21 is formed in each pixel 2 in the pixel sensor substrate 41, and then the plurality of pixel transistors Tr1 and the multilayer wiring layer 81 are formed on the upper surface of the pixel sensor substrate 41. In the multilayer wiring layer 81, the plurality of wiring layers 82, the interlayer insulating films 83, the first insulating film 84, and the second insulating film 85 are formed in the stated order. The second insulating film 85 serves as the bonded surface with the logic substrate 42. Therefore, after formed by a chemical vapor deposition (CVD) method, the surface is flattened by a chemical mechanical polishing (CMP) method, for example.

The scribe region LA is formed in a region (width) imparted with a small margin relative to the dicing region DA which is equivalent to a blade width in dicing as the center as illustrated in FIG. 6A.

Next, as illustrated in FIG. 6B, the groove portion 101 is formed in the scribe region LA. Specifically, resist is patterned by lithography in such a manner that only the predetermined region in the scribe region LA is opened, and then dry etched, whereby the groove portion 101 is formed in the scribe region LA.

After the groove portion 101 is formed, a burying member 102 is applied to the inside of the groove portion 101 and the flattened upper surface of the second insulating film 85 as illustrated in FIG. 6C. Thus, the groove portion 101 is buried by the burying member 102. The film thickness of the burying member 102 formed on the upper surface of the second insulating film 85 is set to a thickness equal to or larger than the depth of the groove portion 111 (FIG. 8) to be formed in the logic substrate 42 serving as a bonding counterpart. A material of the burying member 102 is resin having a Young's modulus of 2.9 Gpa or more and hygroscopicity of 0.24% or less, such as benzocyclobutene (BCB), as described above.

Then, resist is patterned by lithography in such a manner that only a region corresponding to the groove portion 101 is opened, and then dry etched, whereby the burying member 102 is left only in the region corresponding to the groove portion 101 as illustrated in FIG. 6D. Thus, a convex-shaped buried portion 102A projected from the second insulating film 85 is formed.

The convex-shaped buried portion 102A can also be formed by performing polishing in which the selection ratio with the second insulating film 85 laminated by a CVD method is controlled in a CMP method, instead of the etching with a resist pattern.

Figure 7:
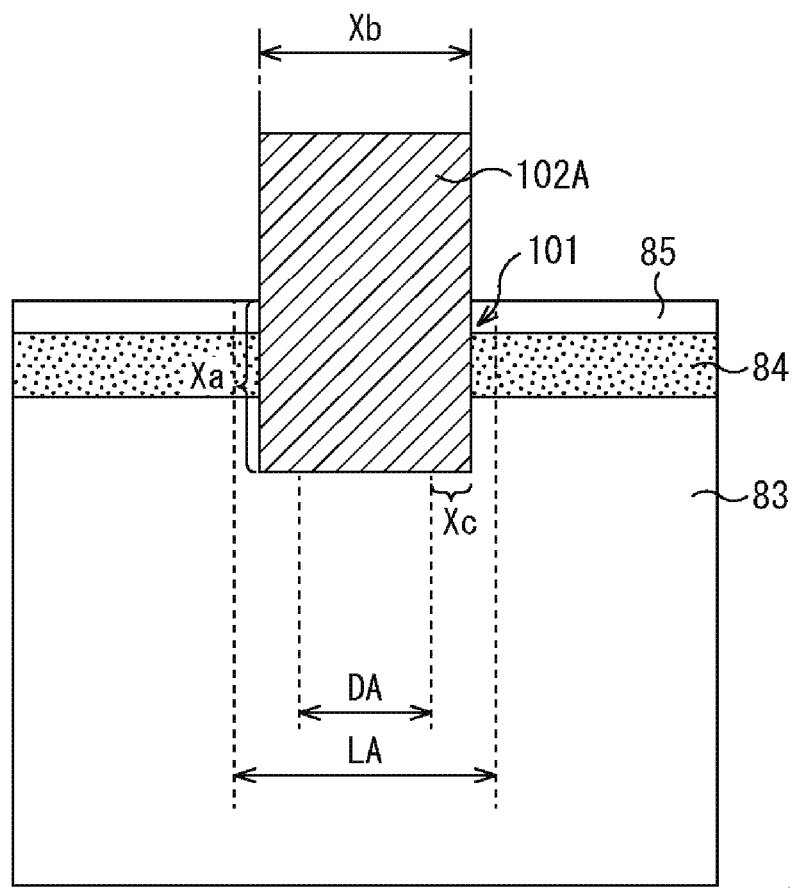
FIG. 7 is a view explaining a first manufacturing method of the first embodiment of the solid state image pickup apparatus.

FIG. 7 is a view for explaining the size of the groove portion 101 to be formed.

The depth Xa of the groove portion 101 is desirably as thin as possible in order not to block the dicing and is set to about 1 to 10 μm, for example.

The width Xb of the groove portion 101 is to be larger than the dicing region DA and is set to about 50 to 200 μm, for example. The projection width Xc from the dicing region DA of the groove portion 101 equivalent to the remaining portion of the buried portion 102A after dicing is set to about 40 to 90 μm.

Figure 8:
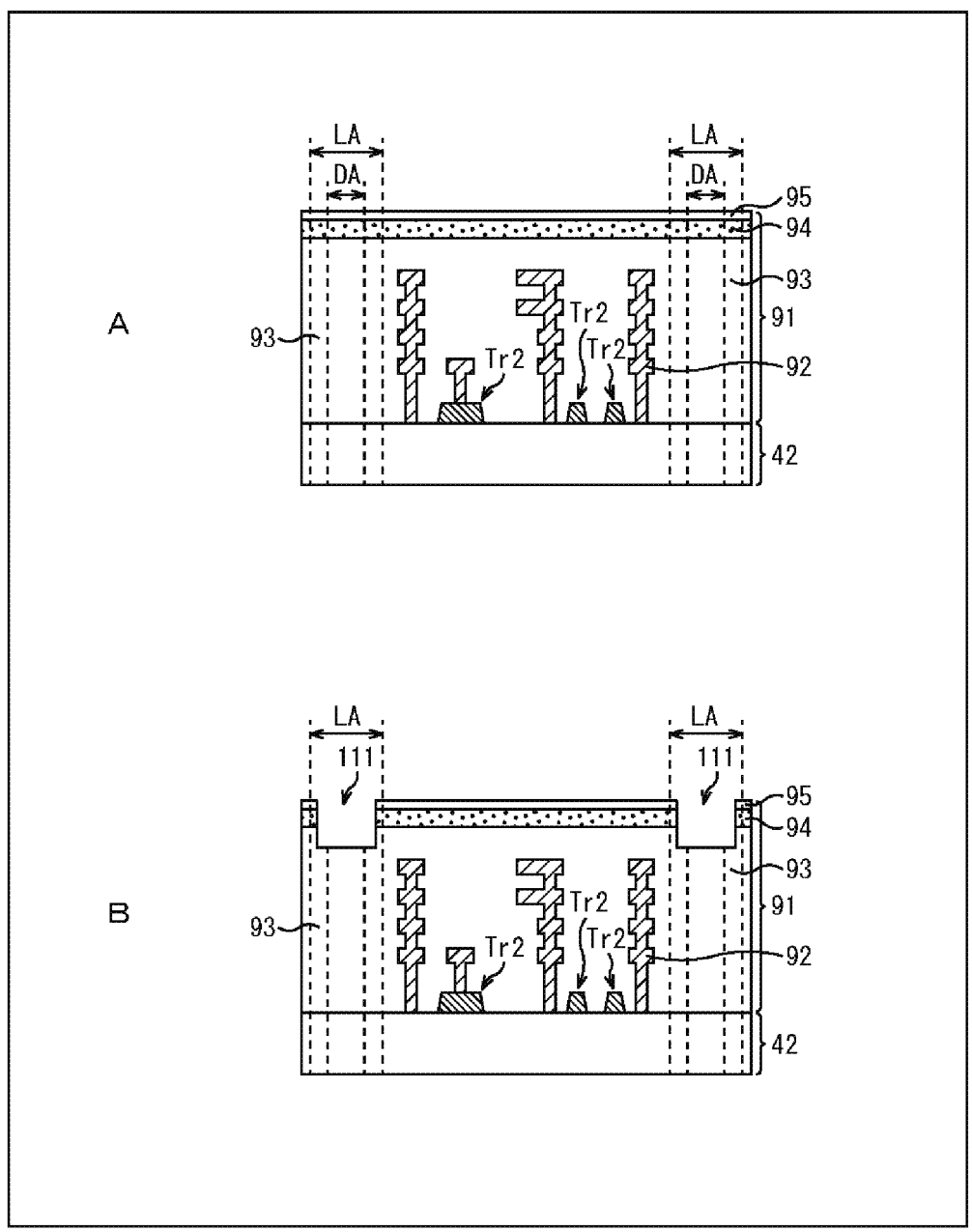
FIG. 8 is a view explaining a first manufacturing method of the first embodiment of the solid state image pickup apparatus.
Figure 9:
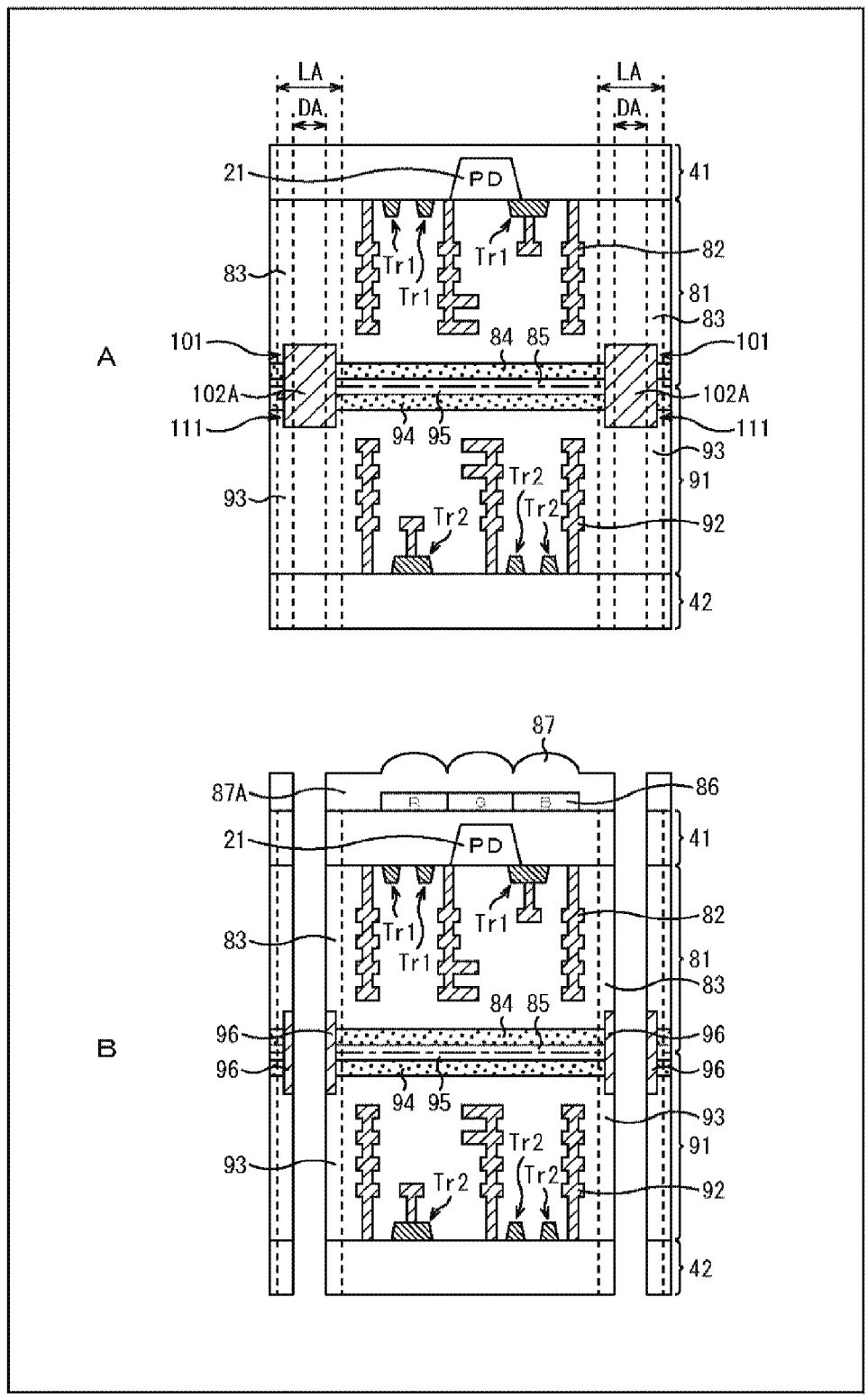
FIG. 9 is a view explaining a first manufacturing method of the first embodiment of the solid state image pickup apparatus.

Next, a manufacturing process of the logic substrate 42 before bonding is described with reference to FIG. 8.

First, as illustrated in FIG. 8A, the plurality of transistors Tr2 and the multilayer wiring layer 91 are formed on the upper surface of the logic substrate 42. In the multilayer wiring layer 91, the plurality of wiring layers 92 and the interlayer insulating films 93, the first insulating film 94, and the second insulating film 95 are formed in the stated order. The second insulating film 95 serves as the bonded surface with the pixel sensor substrate 41. Therefore, the second insulating film 95 is formed by a CVD method, and then the surface is flattened by a CMP method, for example.

Also in the logic substrate 42, the scribe region LA including the dicing region DA is secured at the same position as the position in the pixel sensor substrate 41 as illustrated in FIG. 8A.

Next, resist is patterned by lithography in such a manner that only the predetermined region in the scribe region LA is opened, and then dry etched, whereby the groove portion 111 is formed in the scribe region LA as illustrated in FIG. 8B. The depth of the formed groove portion 111 is equal to the height of a portion (convex portion) projected from the second insulating film 85 of a buried portion 102A formed on the side of the pixel sensor substrate 41 and the width of the groove portion 111 is equal to the width of the groove portion 101 on the side of the pixel sensor substrate 41.

Thus, the pixel sensor substrate 41 and the logic substrate 42 before bonding are completed.

Then, the pixel sensor substrate 41 and the logic substrate 42 which are separately manufactured are bonded to each other by plasma bonding in such a manner that the multilayer wiring layer 81 of the pixel sensor substrate 41 and the multilayer wiring layer 91 of the logic substrate 42 face each other as illustrated in FIG. 9A.

By the bonding, the convex portion of the buried portion 102A formed in the groove portion 101 of the pixel sensor substrate 41 is inserted into the groove portion 111 of the logic substrate 42. Due to the presence of the buried portion 102A, the formation of recessed steps can be prevented in the scribe region LA where neither the wiring layer 82 nor the wiring layer 92 is formed, and therefore voids resulting from the recessed steps can be prevented.

After the bonding of the pixel sensor substrate 41 and the logic substrate 42, the color filter 86 and the on-chip lens 87 are formed on the upper surface of the pixel sensor substrate 41 as illustrated in FIG. 9B. Then, the pixel sensor substrate 41 and the logic substrate 42 which are bonded to each other, i.e., the semiconductor substrate 12, is subjected to dicing along the dicing region DA as illustrated in FIG. 9B to be singulated into a piece of the solid state image pickup apparatus 1.

By the dicing of the buried portion 102A formed in the scribe region LA in the dicing region DA, the buried portion 96 is formed in the peripheral portion of the singulated solid state image pickup apparatus 1 as illustrated in FIG. 9B.

The solid state image pickup apparatus 1 having the cross-sectional structure illustrated in FIG. 5 can be manufactured as described above.

4. Second Manufacturing Method of First Embodiment

Next, a second manufacturing method of the solid state image pickup apparatus 1 having the cross-sectional structure illustrated in FIG. 5 is described with reference to FIGS. 10 to 12.

Figure 10:
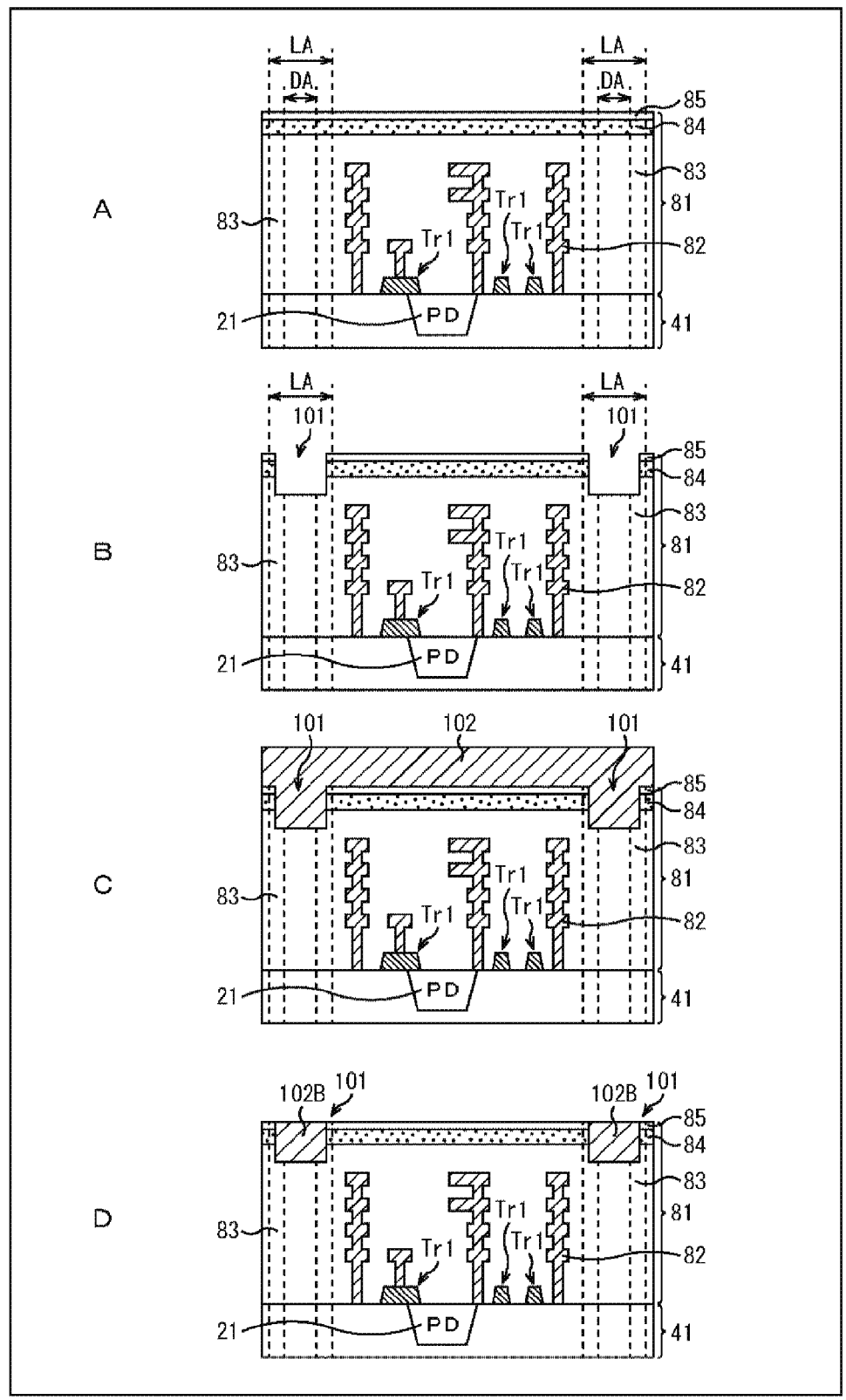
FIG. 10 is a view explaining a second manufacturing method of the first embodiment of the solid state image pickup apparatus.

FIG. 10 is a view illustrating a manufacturing process of the pixel sensor substrate 41 before bonding.

Processes illustrated in FIGS. 10A to 10C are the same as the processes of the first manufacturing method illustrated in FIGS. 6A to 6C.

More specifically, the photodiode 21 is formed in each pixel 2 in the pixel sensor substrate 41, and then the plurality of pixel transistors Tr1 and the multilayer wiring layer 81 are formed on the upper surface of the pixel sensor substrate 41 as illustrated in FIG. 10A.

Then, the groove portion 101 is formed in the scribe region LA as illustrated in FIG. 10B, and then the burying member 102 is applied to the inside of the groove portion 101 and the flattened upper surface of the second insulating film 85 as illustrated in FIG. 10C.

Then, the second manufacturing method is different in the following process illustrated in FIG. 10D from the first manufacturing method described above.

Specifically, the burying member 102 at an upper side relative to the second insulating film 85 is etched by an entire surface etch back method or a CMP method as illustrated in FIG. 10D. Thus, a buried portion 102B in which the burying member 102 remains only in the groove portion 101 is formed.

Thus, the pixel sensor substrate 41 before bonding is completed.

Figure 11:
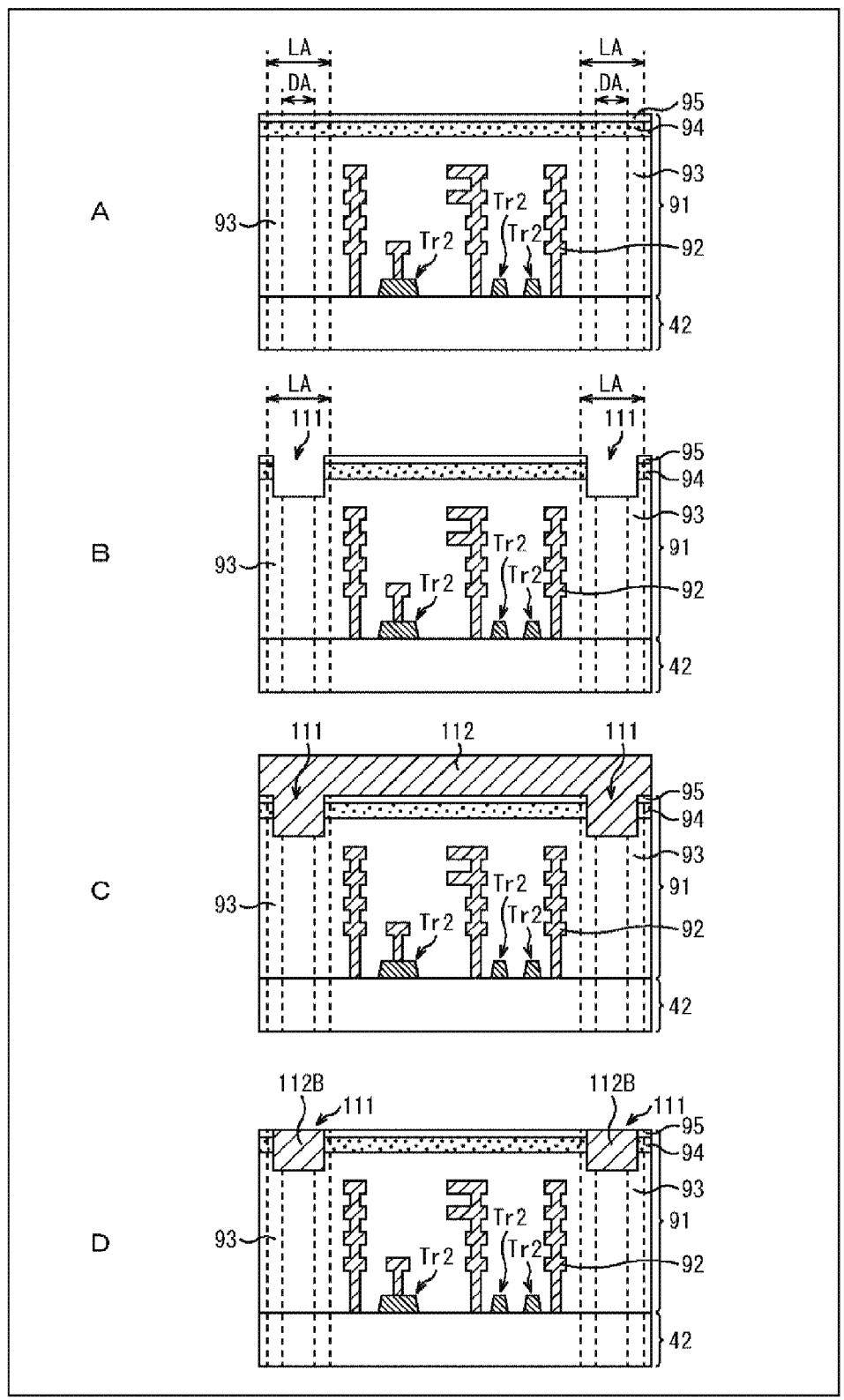
FIG. 11 is a view explaining a second manufacturing method of the first embodiment of the solid state image pickup apparatus.
Figure 12:
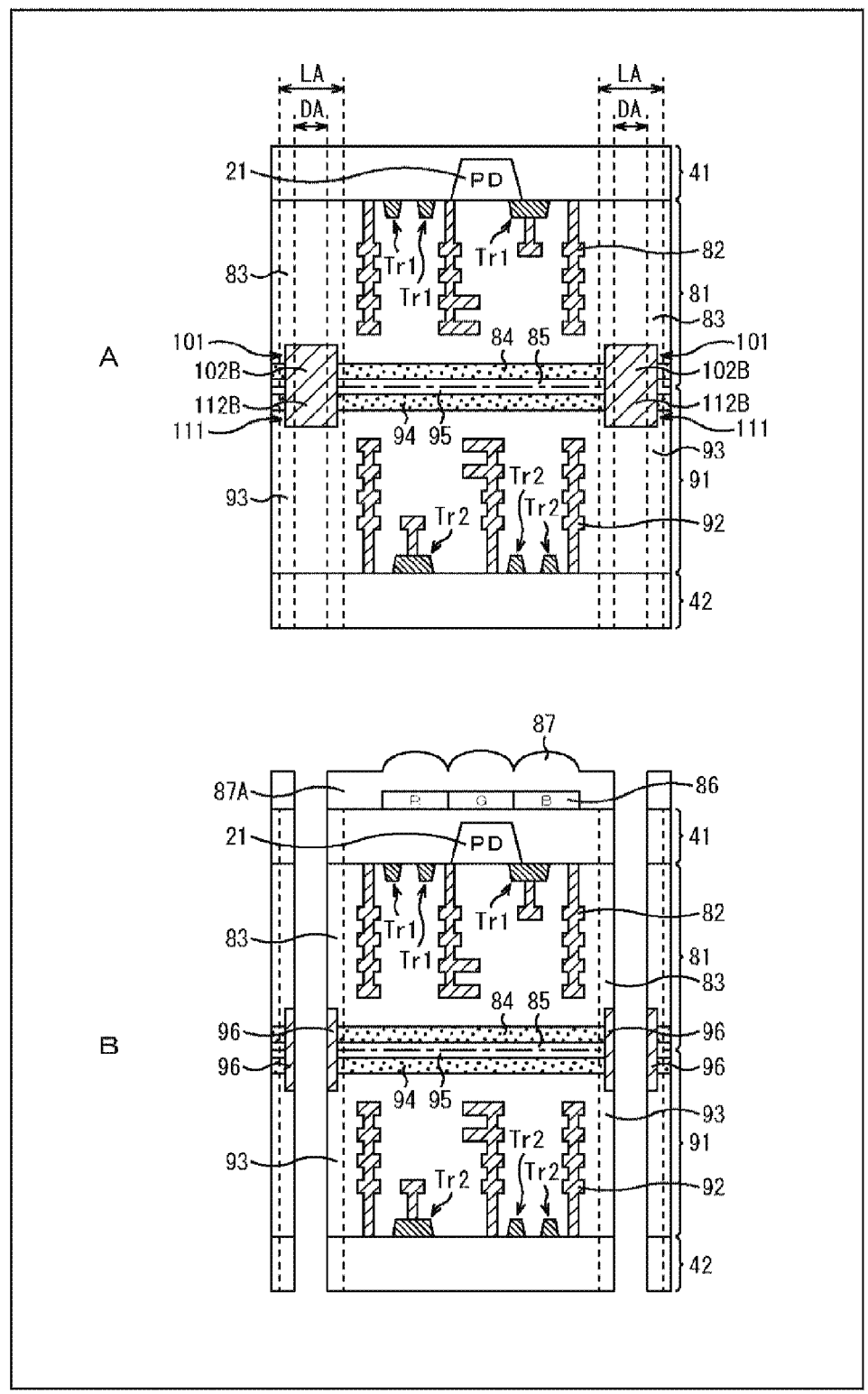
FIG. 12 is a view explaining a second manufacturing method of the first embodiment of the solid state image pickup apparatus.

FIG. 11 is a view illustrating a manufacturing process of the logic substrate 42 before bonding.

Processes illustrated in FIG. 11A and FIG. 11B are the same as the processes of the first manufacturing method illustrated in FIGS. 8A and 8B.

More specifically, as illustrated in FIG. 11A, the plurality of transistors Tr2 and the multilayer wiring layer 91 are formed on the upper surface of the logic substrate 42, and then the surface of the second insulating film 95 of the uppermost surface is flattened by a CMP method, for example. Then, the groove portion 111 is formed in the scribe region LA as illustrated in FIG. 11B.

In the first manufacturing method described above, the process of the logic substrate 42 is completed as described above. However, in the second manufacturing method, a process for burying the burying member 112 into the groove portion 111 is performed in the same manner as in the pixel sensor substrate 41.

More specifically, the burying member 112 is applied to the inside of the groove portion 111 and the flattened upper surface of the second insulating film 95 as illustrated in FIG. 11C. Thus, the groove portion 111 is buried with the burying member 112.

Next, the burying member 112 at an upper side relative to the second insulating film 95 is etched by an entire surface etch back method or the CMP method as illustrated in FIG. 11D. Thus, the buried portion 112B in which the burying member 112 remains only in the groove portion 111 is formed.

Thus, the logic substrate 42 before bonding is completed.

Then, the pixel sensor substrate 41 and the logic substrate 42 which are separately manufactured are bonded to each other by plasma bonding in such a manner that the multilayer wiring layer 81 of the pixel sensor substrate 41 and the multilayer wiring layer 91 of the logic substrate 42 face each other as illustrated in FIG. 12A.

By the bonding, the buried portion 102B formed in the groove portion 101 of the pixel sensor substrate 41 and the buried portion 112B in the groove portion 111 of the logic substrate 42 are bonded to each other, so that bonding with higher bonding strength can be performed.

Due to the presence of the buried portions 102B and 112B, the formation of recessed steps can be prevented in the scribe region LA where neither the wiring layer 82 nor the wiring layer 92 is formed, and therefore voids resulting from the recessed steps can be prevented.

After the bonding of the pixel sensor substrate 41 and the logic substrate 42, the color filter 86 and the on-chip lens 87 are formed on the upper surface of the pixel sensor substrate 41 as illustrated in FIG. 12B. Then, the pixel sensor substrate 41 and the logic substrate 42 which are bonded to each other, i.e., the semiconductor substrate 12, is subjected to dicing along the dicing region DA as illustrated in FIG. 12B to be singulated into a piece of the solid state image pickup apparatus 1.

By the dicing of the buried portions 102B and 112B formed in the scribe region LA in the dicing region DA, the buried portion 96 is formed in the peripheral portion of the singulated solid state image pickup apparatus 1 as illustrated in FIG. 12B.

The solid state image pickup apparatus 1 having the cross-sectional structure illustrated in FIG. 5 can be manufactured as described above.

5. Second Embodiment

Cross-Sectional Structure View of Solid State Image Pickup Apparatus Next, the cross-sectional structure of a second embodiment of the solid state image pickup apparatus 1 is described with reference to FIG. 13.

In the second embodiment of FIG. 13, the components corresponding to those of the first embodiment illustrated in FIG. 5 are designated by the same reference numerals and hereinafter only a configuration different from that of the first embodiment is described.

Figure 13:
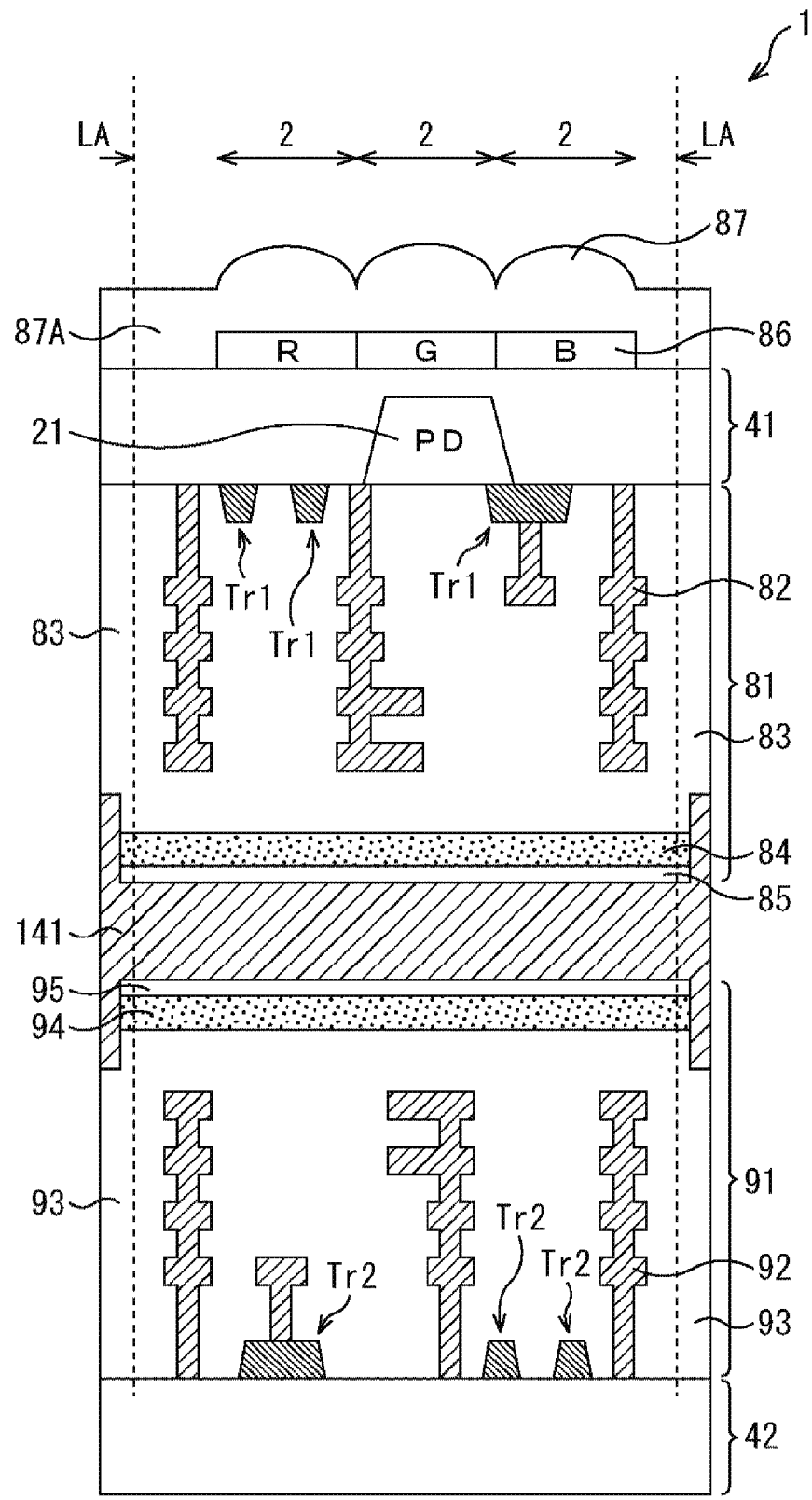
FIG. 13 is a view illustrating the cross-sectional structure of a second embodiment of a solid state image pickup apparatus.

The cross-sectional structure of the solid state image pickup apparatus 1 in the second embodiment is different in that a buried portion 141 is formed throughout the bonded surface of the pixel sensor substrate 41 and the logic substrate 42 as illustrated in FIG. 13. The thickness (film thickness) of the layer of the buried portion 141 is large in the peripheral portion of the solid state image pickup apparatus 1 and is small at the inside thereof.

6. Manufacturing Method of Second Embodiment

A manufacturing method of the solid state image pickup apparatus 1 having the cross-sectional structure illustrated in FIG. 13 is described with reference to FIGS. 14 to 16.

Figure 14:
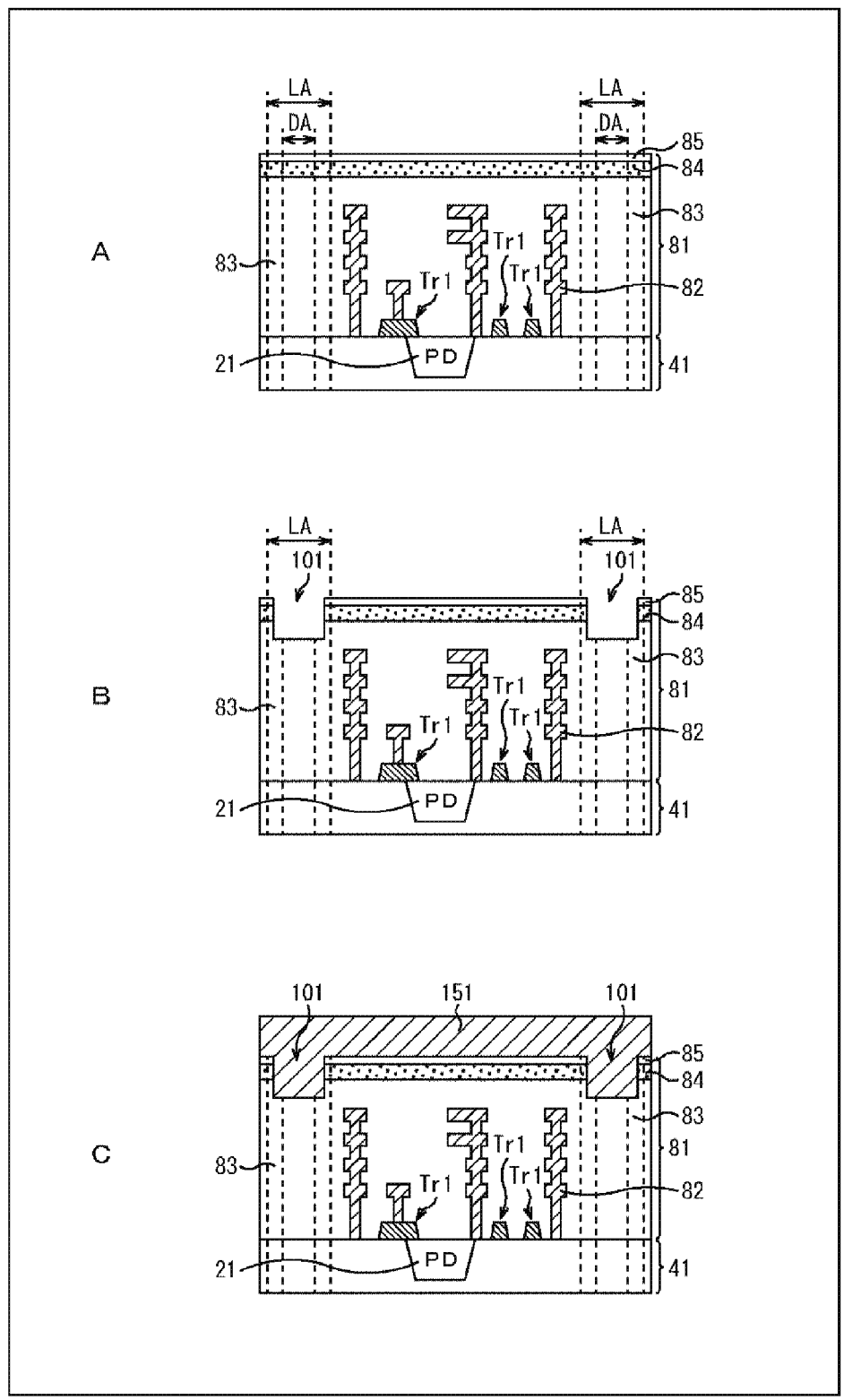
FIG. 14 is a view explaining a manufacturing method of the second embodiment of the solid state image pickup apparatus.

FIG. 14 is a view illustrating a manufacturing process of the pixel sensor substrate 41 before bonding.

Processes illustrated in FIGS. 14A to 14C are the same as the processes of the first manufacturing method in the first embodiment illustrated in FIGS. 6A to 6C.

More specifically, as illustrated in FIG. 14A, the photodiode 21 is formed in each pixel 2 in the pixel sensor substrate 41, and then the plurality of pixel transistors Tr1 and the multilayer wiring layer 81 are formed on the upper surface of the pixel sensor substrate 41.

Then, the groove portion 101 is formed in the scribe region LA as illustrated in FIG. 14B, and then a burying member 151 is applied to the inside of the groove portion 101 and the flattened upper surface of the second insulating film 85 as illustrated in FIG. 14C.

Figure 15:
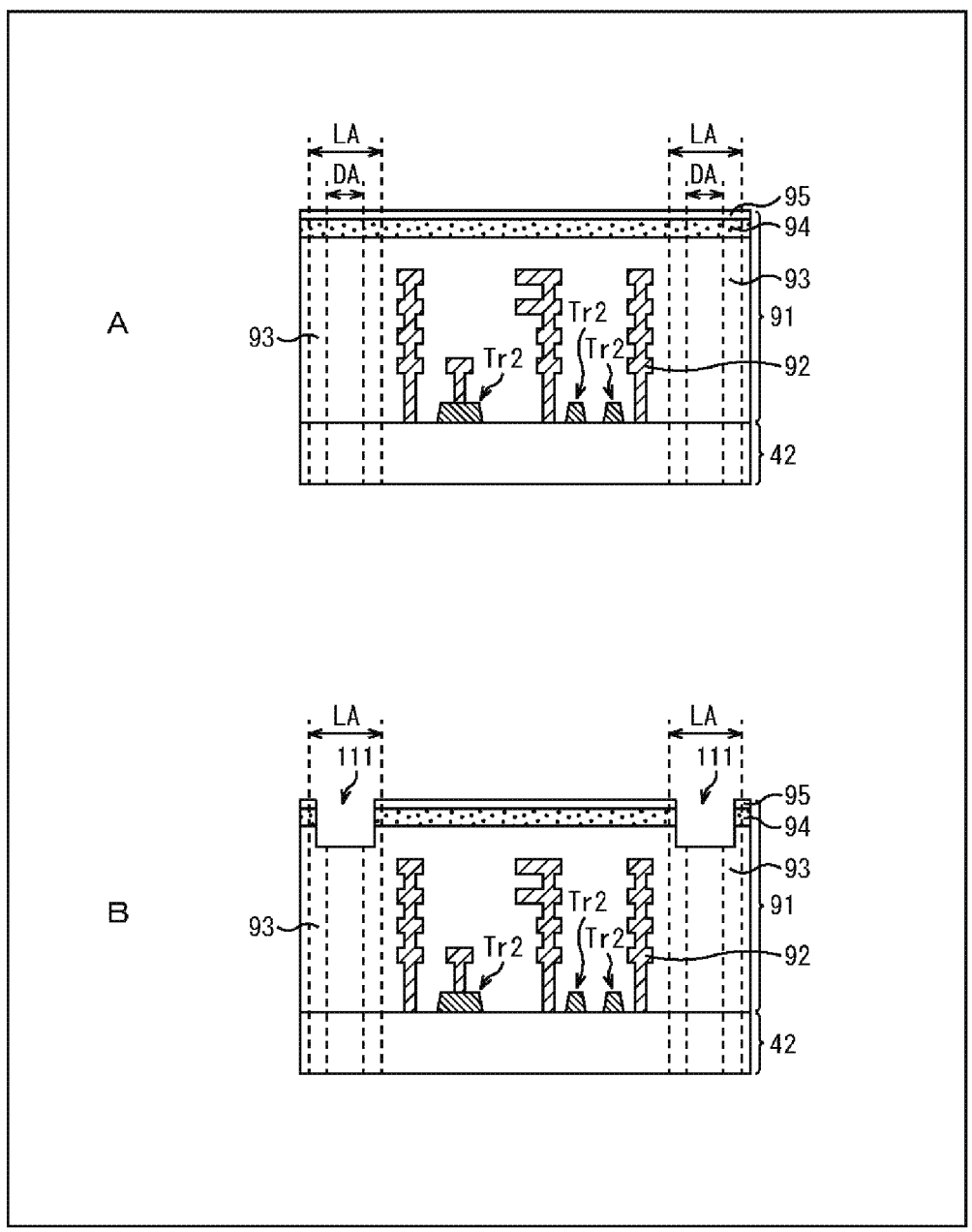
FIG. 15 is a view explaining a manufacturing method of the second embodiment of the solid state image pickup apparatus.
Figure 16:
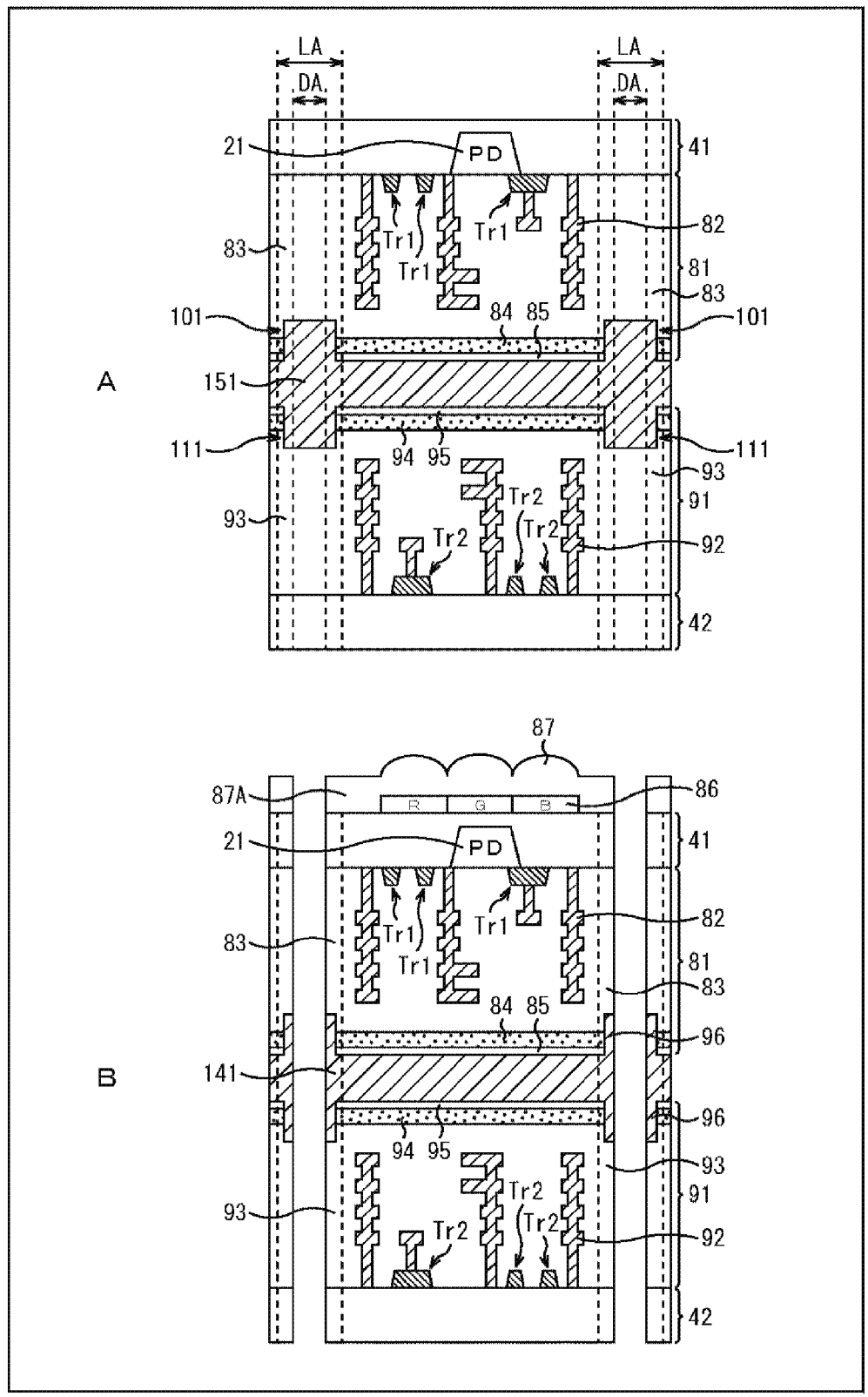
FIG. 16 is a view explaining a manufacturing method of the second embodiment of the solid state image pickup apparatus.

FIG. 15 is a view illustrating a manufacturing process of the logic substrate 42 before bonding.

Processes illustrated in FIGS. 15A and 15B are the same as the processes of the first manufacturing method in the first embodiment illustrated in FIGS. 8A and 8B.

More specifically, as illustrated in FIG. 15A, the plurality of transistors Tr2 and the multilayer wiring layer 91 are formed on the upper surface of the logic substrate 42, and then the surface of the second insulating film 95 of the uppermost surface is flattened by a CMP method, for example. Then, as illustrated in FIG. 15B, the groove portion 111 is formed in the scribe region LA.

Next, as illustrated in FIG. 16A, the pixel sensor substrate 41 and the logic substrate 42 which are separately manufactured are bonded to each other by plasma bonding in such a manner that the multilayer wiring layer 81 of the pixel sensor substrate 41 and the multilayer wiring layer 91 of the logic substrate 42 face each other. When an adhesive is used as a material of the burying member 151, the pixel sensor substrate 41 and the logic substrate 42 are bonded to each other by adhesive bonding.

By the bonding process, the burying member 151 formed throughout the upper side including the groove portion 101 of the pixel sensor substrate 41 enters the groove portion 111 of the logic substrate 42.

After the pixel sensor substrate 41 and the logic substrate 42 are bonded to each other, the color filter 86 and the on-chip lens 87 are formed on the upper surface of the pixel sensor substrate 41 as illustrated in FIG. 16B. Then, the pixel sensor substrate 41 and the logic substrate 42 which are bonded to each other, i.e., the semiconductor substrate 12, is subjected to dicing along the dicing region DA as illustrated in FIG. 16B to be singulated into a piece of the solid state image pickup apparatus 1.

The burying member 151 after the dicing is equivalent to the buried portion 141 of FIG. 13.

The solid state image pickup apparatus 1 having the cross-sectional structure illustrated in FIG. 13 can be manufactured as described above.

As described above, the solid state image pickup apparatus 1 according to an embodiment of the present disclosure can prevent the formation of recessed steps in the scribe region LA where neither the wiring layer 82 nor the wiring layer 92 is formed due to the presence of the buried portion 96 or 141 in the scribe region LA, and therefore voids resulting from the recessed steps can be prevented. Furthermore, by preventing the formation of the voids, a reduction in bonding strength is also prevented.

Since the bonded surface of the pixel sensor substrate 41 and the logic substrate 42 is not exposed by the buried portion 96 or 141, the formation of cracks from the bonded surface as the starting point and moisture absorption into the solid state image pickup apparatus 1 from the cracks can be prevented.

By a reduction in voids or cracks, the yield improves and also the reliability of the apparatus also improves. Therefore, the solid state image pickup apparatus 1 according to an embodiment of the present disclosure can increase the reliability in the structure in which two semiconductor substrates are bonded to each other.

The solid state image pickup apparatus 1 can prevent moisture absorption, and therefore can stand the use in a severe environment. Therefore, the solid state image pickup apparatus 1 can be used for not only a digital still camera but a wide range of applications, such as a surveillance camera and an onboard camera.

7. Application Example to Electronic Device of Second Embodiment

The technique of the present disclosure is not limited to the application to a solid state image pickup apparatus. More specifically, the technique of the present disclosure can be applied to general electronic devices in which a solid state image pickup apparatus is used for an image capturing unit (photoelectric conversion unit), such as image pickup devices, such as a digital still camera and a video camera, mobile terminals having an image pickup function, and copying machines in which a solid state image pickup apparatus is used for an image reading unit. The solid state image pickup apparatus may have a form of one chip or may have a module-like form having an image pickup function in which an image pickup unit and a signal processing unit or an optical system are collectively packaged.

Figure 17:
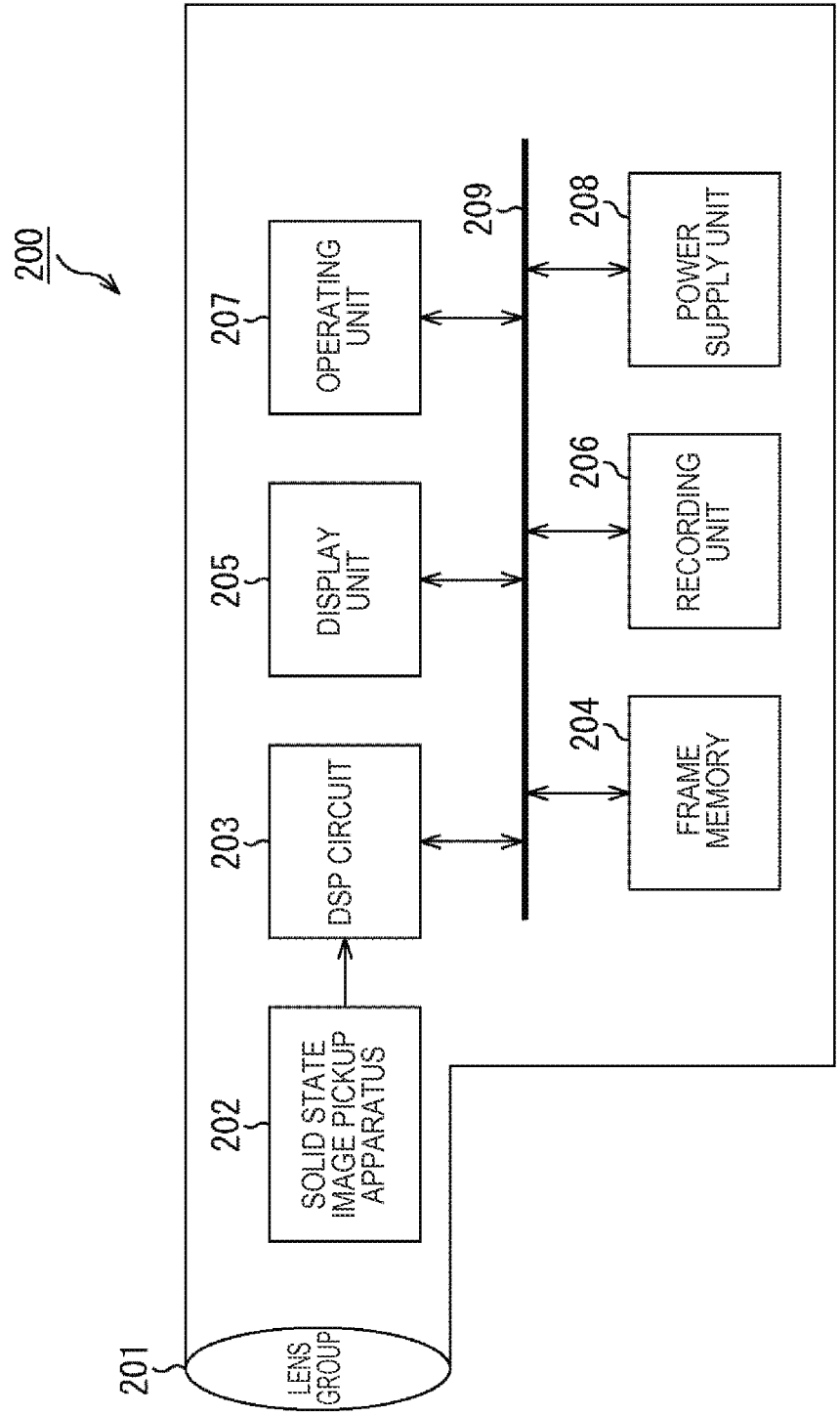
FIG. 17 is a block diagram illustrating an example of the configuration of an image pickup device as an electronic device according to an embodiment of the present disclosure.

FIG. 17 is a block diagram illustrating an example of the configuration of an image pickup device as an electronic device according to an embodiment of the present disclosure.

An image pickup device 200 of FIG. 17 has an optical unit 201 containing a lens group and the like, a solid state image pickup apparatus (image pickup device) 202 employing the configuration of the solid state image pickup apparatus 1 of FIG. 1, and a digital signal processor (DSP) circuit 203 which is a camera signal processing circuit. Moreover, the image pickup device 200 also has a frame memory 204, a display unit 205, a recording unit 206, an operating unit 207, and a power supply unit 208. The DSP circuit 203, the frame memory 204, the display unit 205, the recording unit 206, the operating unit 207, and the power supply unit 208 are connected to each other through a bus line 209.

The optical unit 201 captures incident light (image light) from a subject, and then forms an image thereof on the image pickup surface of the solid state image pickup apparatus 202. The solid state image pickup apparatus 202 converts the light quantity of the incident light which is formed into an image on the image pickup surface by the optical unit 201 to electric signals in units of pixels, and then outputs the signals as pixel signals. As the solid state image pickup apparatus 202, the solid state image pickup apparatus 1 of FIG. 1, i.e., the solid state image pickup apparatus which increases the reliability by providing the buried portion 96 or 141 in the scribe region LA, can be used.

The display unit 205 contains a panel type display, such as a liquid crystal panel or an organic electro luminescence (EL) panel, and displays moving images or still images captured by the solid state image pickup apparatus 202, for example. The recording nit 206 records moving images or still images captured by the solid state image pickup apparatus 202 on recording media, such as a hard disk and a semiconductor memory.

The operating unit 207 issues an operation instruction for various functions of the image pickup device 200 by an operation of a user. The power supply unit 208 supplies various kinds of power supply serving as the operation power supply of the DSP circuit 203, the frame memory 204, the display unit 205, the recording unit 206, and the operating unit 207 as appropriate to these supply targets.

As described above, the reliability of the image pickup device 200, such as a video camera, a digital still camera, and a camera module for mobile devices, such as cellular phones, can be increased by the use of the solid state image pickup apparatus 1 of FIG. 1 as the solid state image pickup apparatus 202.

The embodiments of the present disclosure are not limited to the embodiments described above and can be variously altered without deviating from the scope of the present disclosure.

For example, the wiring layer is formed on each of the two semiconductor substrates (the pixel sensor substrate 41 and the logic substrate 42) to be bonded to each other in the embodiment described above but one semiconductor substrate may be provided with only an insulating film (protective film) and may not be provided with the wiring layer.

Moreover, in the examples described above, two semiconductor substrates are bonded to each other in such a manner that the wiring layers (the multilayer wiring layer 81 and the multilayer wiring layer 91) of each of the two semiconductor substrates face each other. However, the technique of the present disclosure is applicable also to a solid state image pickup apparatus in which a wiring layer side of one semiconductor substrate and a non-wiring layer side of the other semiconductor substrate are bonded to each other.

More specifically, the solid state image pickup apparatus 1 can be configured so that the surface opposite to the surface on the side of the multilayer wiring layer 91 of the logic substrate 42 is bonded to the multilayer wiring layer 81 of the pixel sensor substrate 41 and the bonded surface is not exposed by the buried portion 96 provided in the peripheral portion. In this case, the side on the multilayer wiring layer 81 of the logic substrate 42 and the multilayer wiring layer 91 of the pixel sensor substrate 41 are connected by a penetration via which penetrates the logic substrate 42.

Moreover, the technique of the present disclosure is applicable not only to bonding of two semiconductor substrates but bonding of three or more semiconductor substrates.

The technique of the present disclosure is applicable to not only the solid state image pickup apparatus which detects distribution of the incident light quantity of visible rays, and then captures the same as an image but also a solid state image pickup apparatus which captures distribution of the incident amount of infrared rays, X-rays, particles, or the like as an image and, in a broad sense, a general solid state image pickup apparatus (physical quantity distribution detection apparatus), such as a fingerprint detecting sensor, which detects distribution of the other physical quantities, such as pressure and electrostatic capacity, and then captures the same as an image.

Moreover, the technique of the present disclosure is applicable to not only the solid state image pickup apparatus but a semiconductor device (semiconductor chip) having another semiconductor integrated circuit and is constituted by bonding of two semiconductor substrates.

The effects described in this specification are merely examples and not limited and effects other than the effects described in this specification may be demonstrated.

Additionally, the present technology may also be configured as below.

(1) A solid state image pickup apparatus including:
a first semiconductor substrate and a second semiconductor substrate which are bonded to each other; and
a buried portion formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

(2) The solid state image pickup apparatus according to (1), wherein the buried portion is formed by performing dicing of a material of the buried portion formed in a scribe region of a semiconductor wafer in which the first semiconductor substrate and the second semiconductor substrate are bonded to each other.

(3) The solid state image pickup apparatus according to (1) or (2),
wherein a material of the buried portion is a material having a Young's modulus of 2.9 Gpa or more.

(4) The solid state image pickup apparatus according to any one of (1) to (3),
wherein a material of the buried portion is a material having hygroscopicity of 0.24% or less.

(5) The solid state image pickup apparatus according to any one of (1) to (4),
wherein a material of the buried portion is benzocyclobutene.

(6) The solid state image pickup apparatus according to any one of (1) to (5),
wherein the bonded surface of the first semiconductor substrate and the second semiconductor substrate is a surface where a first insulating film formed on the first semiconductor substrate and a second insulating film formed on the second semiconductor substrate are bonded to each other.

(7) The solid state image pickup apparatus according to any one of (1) to (5),
wherein the buried portion is formed with a predetermined thickness between the first semiconductor substrate and the second semiconductor substrate, and
a thickness of the peripheral portion of the apparatus is larger than a thickness of an inner side of the apparatus.

(8) A method for manufacturing a solid state image pickup apparatus, the method including:
forming a groove portion of a predetermined depth with a width larger than a dicing width in a scribe region to each of a first insulating film formed on a first semiconductor substrate and a second insulating film formed on a second semiconductor substrate;
bonding the first semiconductor substrate and the second semiconductor substrate after burying a material of a buried portion into at least one of the groove portion individually formed in each of the first insulating film and the second insulating film; and
performing dicing of the first semiconductor substrate and the second semiconductor substrate which are bonded to each other along the scribe region to thereby form the buried portion formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

(9) The method for manufacturing a solid state image pickup apparatus according to (8),
wherein, in the bonding, the material of the buried portion is applied to an entire surface of an upper surface of the first insulating film including an inside of the groove portion, then the material of the buried portion is etched in such a manner that only a region corresponding to the groove portion remains to form the buried portion having a convex shape, and then the first semiconductor substrate and the second semiconductor substrate are bonded to each other.

(10) The method for manufacturing a solid state image pickup apparatus according to (9),
wherein the buried portion having the convex shape is formed by lithography.
(11) The method for manufacturing a solid state image pickup apparatus according to (9),
wherein the buried portion having a convex shape is formed by a chemical mechanical polishing method in which a selection ratio with the first insulating film is controlled.
(12) The method for manufacturing a solid state image pickup apparatus according to (9),
wherein, in the bonding of the first semiconductor substrate and the second semiconductor substrate, the buried portion having a convex shape is inserted into the groove portion of the second insulating film.
(13) The method for manufacturing the solid state image pickup apparatus according to (8),
wherein, in the bonding, the material of the buried portion is buried into the groove portion of each of the first insulating film and the second insulating film, and then the first semiconductor substrate and the second semiconductor substrate are bonded to each other.
(14) The method for manufacturing a solid state image pickup apparatus according to (8),
wherein, in the bonding, the material of the buried portion is applied to an entire surface of an upper surface of the first insulating film including the groove portion, and then the first semiconductor substrate and the second semiconductor substrate are bonded to each other.
(15) The method for manufacturing a solid state image pickup apparatus according to any one of (8) to (14),
wherein a depth of the groove portion formed in the forming of the groove portion is within 10 μm.
(16) The method for manufacturing a solid state image pickup apparatus according to any one of (8) to (15),
wherein a width of the groove portion formed in the forming of the groove portion is 50 to 200 μm.
(17) A semiconductor device including:
a first semiconductor substrate and a second semiconductor substrate which are bonded to each other; and
a buried portion formed in a peripheral portion of the device with a depth of a bonded surface of the first semiconductor substrate and the second semiconductor substrate in such a manner that the bonded surface of the first semiconductor substrate and the second semiconductor substrate is not exposed.
(18) An electronic device including:
a solid state image pickup apparatus including
a first semiconductor substrate and a second semiconductor substrate which are bonded to each other, and
a buried portion formed in a peripheral portion of the apparatus with a depth of a bonded surface of the first semiconductor substrate and the second semiconductor substrate in such a manner that the bonded surface of the first semiconductor substrate and the second semiconductor substrate is not exposed.

What is claimed is:
1. An image pickup apparatus comprising:
a first semiconductor substrate;
a second semiconductor substrate bonded to the first semiconductor substrate;
a buried portion formed in a peripheral portion of the apparatus;
a first interlayer insulating film; and
a second interlayer insulating film,
wherein,
the buried portion is adjacent to and contacts a first insulating film of the first semiconductor substrate, a second insulating film of the second semiconductor substrate, and a side surface of a bonded portion between the first semiconductor substrate and the second semiconductor substrate,
the buried portion contacts a side surface of the first interlayer insulating film and a side surface of the second interlayer insulating film, and
the first insulating film of the first semiconductor substrate and the second insulating film of the second semiconductor substrate are disposed between the first interlayer insulating film and the second interlayer insulating film.
2. The image pickup apparatus according to claim 1, wherein a material of the buried portion is a material having a Young's modulus of 2.9 Gpa or more.
3. The image pickup apparatus according to claim 1, wherein a material of the buried portion is a material having hygroscopicity of 0.24% or less.
4. The image pickup apparatus according to claim 1, wherein a material of the buried portion is benzocyclobutene.
5. The image pickup apparatus according to claim 1, wherein the bonded portion of the first semiconductor substrate and the second semiconductor substrate is where the first insulating film formed on the first semiconductor substrate and the second insulating film formed on the second semiconductor substrate are bonded to each other.
6. A semiconductor device comprising:
a first semiconductor substrate;
a second semiconductor substrate bonded to the first semiconductor substrate;
a buried portion formed in a peripheral portion of the device;
a first interlayer insulating film; and
a second interlayer insulating film,
wherein,
the buried portion is adjacent to and contacts a first insulating film of the first semiconductor substrate, a second insulating film of the second semiconductor substrate, and a side surface of a bonded portion between the first semiconductor substrate and the second semiconductor substrate,
the buried portion contacts a side surface of the first interlayer insulating film and a side surface of the second interlayer insulating film, and
the first insulating film of the first semiconductor substrate and the second insulating film of the second semiconductor substrate are disposed between the first interlayer insulating film and the second interlayer insulating film.
7. An electronic device comprising:
an image pickup apparatus including:
a first semiconductor substrate,
a second semiconductor substrate bonded to the first semiconductor substrate;
a buried portion formed in a peripheral portion of the apparatus;
a first interlayer insulating film; and
a second interlayer insulating film,
wherein,
the buried portion is adjacent to and contacts a side surface of a bonded portion between the first semiconductor substrate and the second semiconductor substrate,
the buried portion contacts a side surface of the first interlayer insulating film and a side surface of the second interlayer insulating film, and the first insulating film of the first semiconductor substrate and the second insulating film of the second semiconductor substrate are disposed between the first interlayer insulating film and the second interlayer insulating film.

8. The image pickup apparatus according to claim 1, further including a multilayer wiring layer, wherein the buried portion contacts the multilayer wiring layer.

9. The image pickup apparatus according to claim 8, further including a second multilayer wiring layer, wherein the buried portion contacts the second multilayer wiring layer.

10. The image pickup apparatus according to claim 9, wherein the bonded portion is between the multilayer wiring layer and the second multilayer wiring layer.

11. The image pickup apparatus according to claim 1, wherein the buried portion contacts a surface of the first insulating film of the first semiconductor substrate that is perpendicular to a depth direction of the first semiconductor substrate.

12. The semiconductor device according to claim 6, wherein a material of the buried portion is a material having a Young's modulus of 2.9 Gpa or more.

13. The semiconductor device according to claim 6, wherein a material of the buried portion is a material having hygroscopicity of 0.24% or less.

14. The semiconductor device according to claim 6, wherein the bonded portion of the first semiconductor substrate and the second semiconductor substrate is where the first insulating film formed on the first semiconductor substrate and the second insulating film formed on the second semiconductor substrate are bonded to each other.

* * * * *